(12) United States Patent
Wang

(10) Patent No.: US 9,837,582 B1
(45) Date of Patent: Dec. 5, 2017

(54) DISPLAY DEVICE

(71) Applicant: InnoLux Corporation, Miao-Li County (TW)

(72) Inventor: Hui-Chi Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/464,559

(22) Filed: Mar. 21, 2017

(30) Foreign Application Priority Data

May 11, 2016 (CN) .......................... 2016 1 0307720

(51) Int. Cl.
| | | |
|---|---|---|
| *H01L 33/20* | (2010.01) | |
| *H01L 33/46* | (2010.01) | |
| *H01L 33/06* | (2010.01) | |
| *H01L 33/24* | (2010.01) | |
| *H01L 33/32* | (2010.01) | |
| *H01L 33/38* | (2010.01) | |
| *H01L 29/861* | (2006.01) | |

(52) U.S. Cl.
CPC .......... *H01L 33/46* (2013.01); *H01L 29/8613* (2013.01); *H01L 33/06* (2013.01); *H01L 33/20* (2013.01); *H01L 33/24* (2013.01); *H01L 33/32* (2013.01); *H01L 33/38* (2013.01)

(58) Field of Classification Search
CPC ...................... H01L 29/66007; H01L 31/0248
See application file for complete search history.

(56) References Cited

U.S. PATENT DOCUMENTS

2016/0240759 A1* 8/2016 Chae ....................... H01L 33/62

* cited by examiner

*Primary Examiner* — Cheung Lee
(74) *Attorney, Agent, or Firm* — McClure, Qualey & Rodack, LLP

(57) ABSTRACT

A display device is provided. The display device includes a substrate and a light-emitting diode. The light-emitting diode includes first and second conductive-type semiconductor layers and a light-emitting layer. The second conductive-type semiconductor layer is adjacent to the substrate. The first conductive-type semiconductor layer includes a bulk portion and a reflection layer disposed over a side of the bulk portion. The bulk portion has a first surface away from the light-emitting layer and a second surface adjacent to the light-emitting layer. The second conductive-type semiconductor layer has a third surface adjacent to the light-emitting layer and a fourth surface away from the light-emitting layer. There is a specific relationship between the width of the first surface, the width of the light-emitting layer, the distance from the first surface to the fourth surface, and the distance from the first surface to the light-emitting layer.

19 Claims, 27 Drawing Sheets

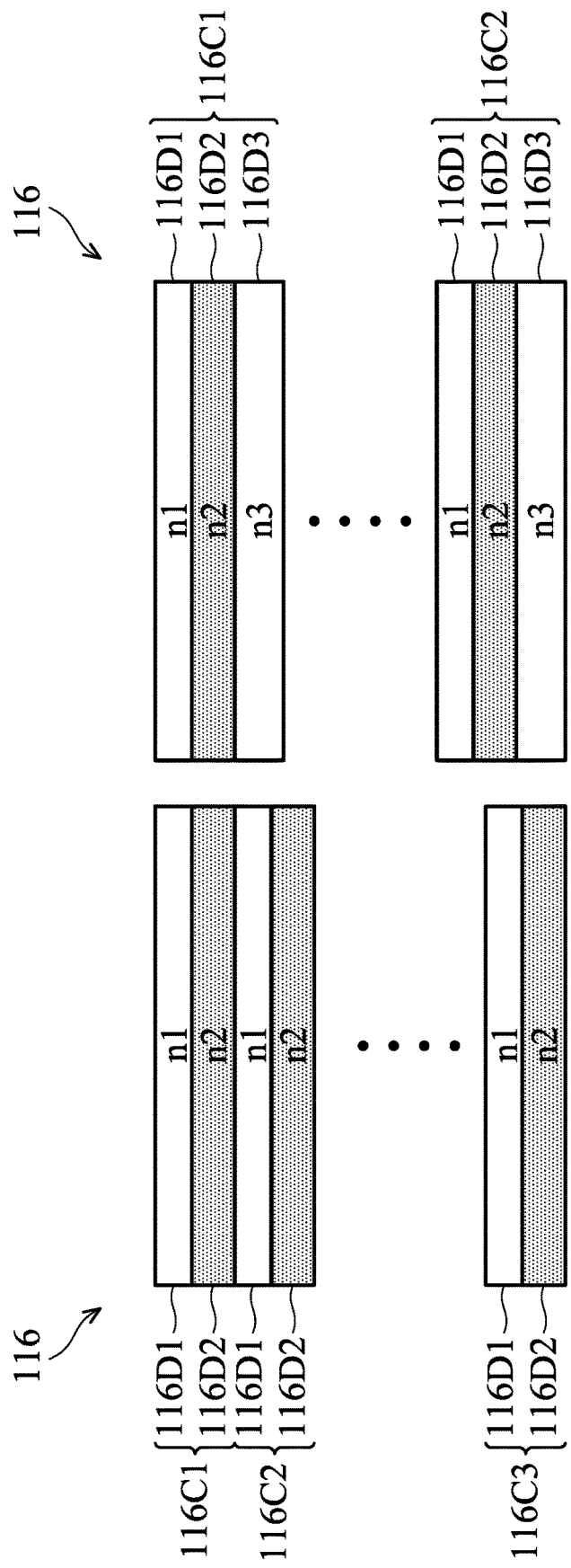

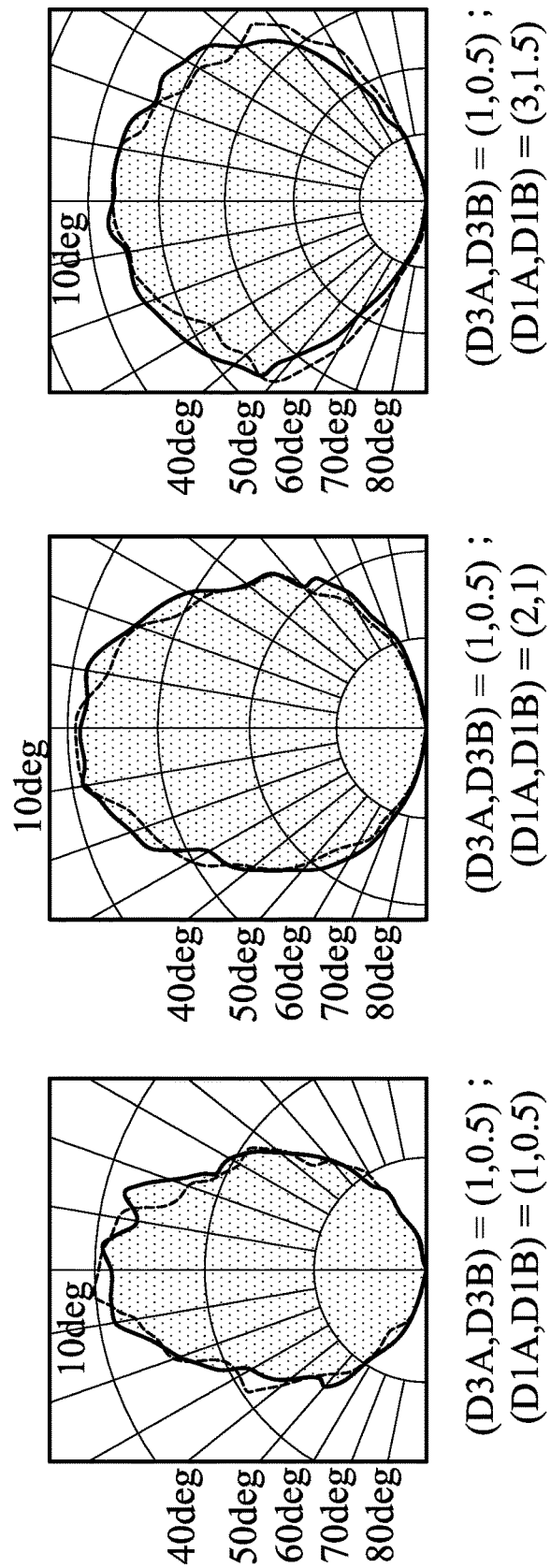

(D3A,D3B) = (1,0.5) ;
(D1A,D1B) = (5,2.5)

(D3A,D3B) = (1,0.5) ;
(D1A,D1B) = (4,2)

R = 0.328-0.375

R = 0.3-0.328

R = 0.269-0.3

R = 0.49-0.857

R = 0.375-0.490

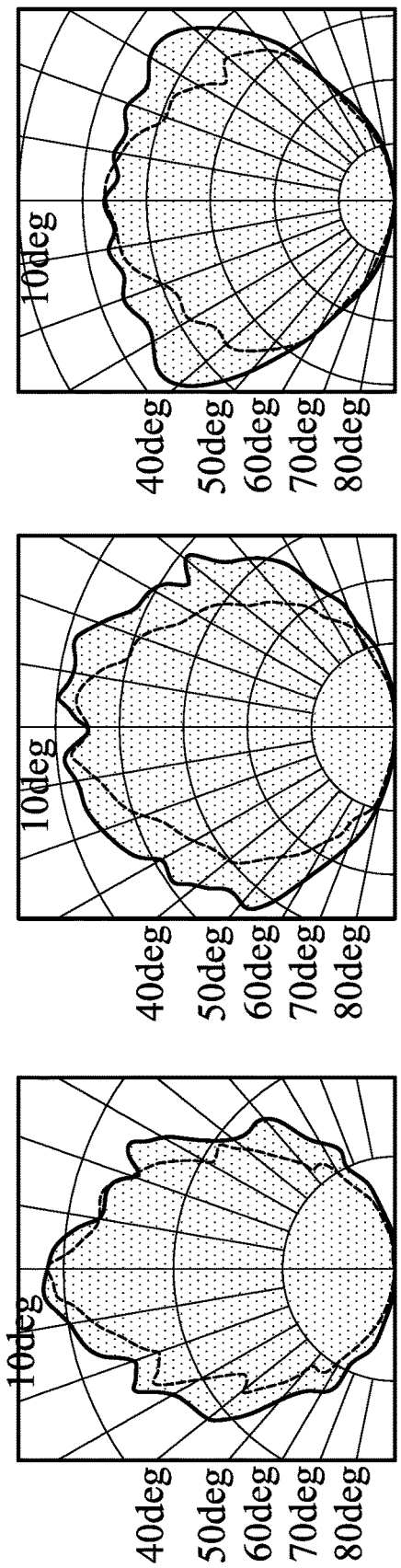

(D3A,D3B) = (1,0.5) ;
(D1A,D1B) = (5,2.5)

(D3A,D3B) = (1,0.5) ;
(D1A,D1B) = (4,2)

DISPLAY DEVICE

CROSS REFERENCE TO RELATED APPLICATIONS

This application claims priority of China Patent Application No. 201610307720.1, filed on May 11, 2016, the entirety of which is incorporated by reference herein.

BACKGROUND

Field of the Invention

The disclosure relates to a display device, and in one embodiment to a display device having a light-emitting diode chip.

Description of the Related Art

As digital technology develops, display devices are becoming more widely used in our society. For example, display devices have been applied in modern information and communication devices such as televisions, notebooks, computers, mobile phones, and smartphones. In addition, each generation of display devices has been developed to be thinner, lighter, smaller, and more fashionable than the last. These display devices include light-emitting diode display devices.

The recombination radiation of electron and hole in the light-emitting diode may produce electromagnetic radiation (such as light) through the current at the p-n junction. For example, in a forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors.

Since mass production has recently become the tendency in the light-emitting diode industry, any increase in the yield of manufacturing light-emitting diodes will reduce costs and result in huge economic benefits. However, existing display devices have not been satisfactory in every respect. For example, when the light-emitting view angle and the light-emitting shape of the light-emitting diode display device have to be altered, an additional second lens layer needs to be disposed over the light-emitting surface. However, this greatly increases the cost.

Therefore, a display device which may alter the light-emitting view angle and the light-emitting shape freely or may improve the light-emitting effectiveness is needed.

BRIEF SUMMARY

The present disclosure provides a display device, including: a substrate; a light-emitting diode disposed over the substrate, wherein the light-emitting diode includes: a first conductive-type semiconductor layer, a light-emitting layer and a second conductive-type semiconductor layer, wherein the light-emitting layer is disposed between the first conductive-type semiconductor layer and the second conductive-type semiconductor layer, wherein the second conductive-type semiconductor layer is adjacent to the substrate, wherein the first conductive-type semiconductor layer includes a bulk portion and a reflection layer disposed over a side of the bulk portion, wherein the bulk portion has a first surface away from the light-emitting layer and a second surface adjacent to the light-emitting layer, and the second conductive-type semiconductor layer has a third surface adjacent to the light-emitting layer and a fourth surface away from the light-emitting layer. When viewed from a cross-sectional view, there is a specific relationship between the width of the first surface, the width of the light-emitting layer, the distance from the first surface to the fourth surface, and the distance from the first surface to the light-emitting layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 2A is a cross-sectional view of the reflection layer in accordance with some embodiments of the present disclosure;

FIG. 2B is a cross-sectional view of the reflection layer in accordance with some embodiments of the present disclosure;

FIG. 5D is a distribution figure of the emitted light at various view angles in accordance with some embodiments of the present disclosure;

FIG. 5E is a distribution figure of the emitted light at various view angles in accordance with some embodiments of the present disclosure;

FIG. 5F is a distribution figure of the emitted light at various view angles in accordance with some embodiments of the present disclosure;

FIG. 7D is a distribution figure of the emitted light at various view angles in accordance with some embodiments of the present disclosure;

FIG. 7E is a distribution figure of the emitted light at various view angles in accordance with some embodiments of the present disclosure;

FIG. 7F is a distribution figure of the emitted light at various view angles in accordance with some embodiments of the present disclosure;

DETAILED DESCRIPTION

Figure 1A:
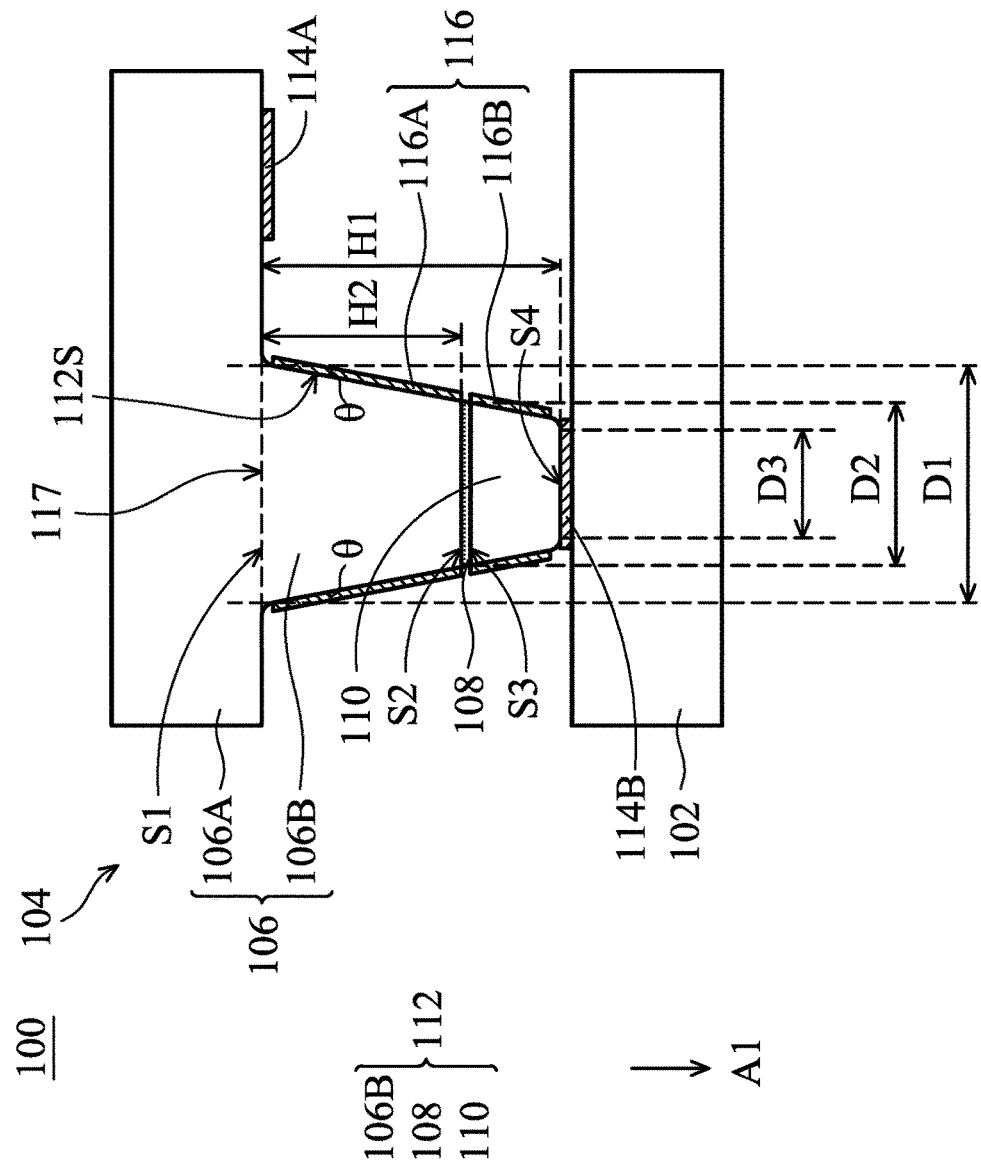
FIG. 1A is a cross-sectional view of a display device in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All needed transistor elements may already be formed over the substrate. However, the substrate is represented with a flat surface in order to simplify the drawing. The term "substrate surface" is meant to include the uppermost exposed layers on a transparent substrate, such as an insulating layer and/or metallurgy lines. The material of the substrate may include glass, plastic or any other materials or layers which the wires or transistor elements may be formed on, such as polyimide (PI). The substrate may also be a flexible substrate.

In some embodiments of the present disclosure, since the specific width and distance in the stack structure of the light-emitting diode have a specific relationship, the light-emitting diode display device in some embodiments of the present disclosure may alter the light-emitting view angle and the light-emitting shape freely and/or may improve the light-emitting effectiveness.

FIG. 1A is a cross-sectional view of a display device 100 in accordance with some embodiments of the present disclosure. As shown in FIG. 1A, the display device 100 includes a substrate 102 and a light-emitting diode 104 disposed over the substrate 102. In some embodiments of the present disclosure, the substrate 102 may include a thin film transistor substrate.

The light-emitting diode 104 may include the first conductive-type semiconductor layer 106. The first conductive-type semiconductor layer 106 has a substrate portion 106A and a bulk portion 106B disposed over the substrate portion 106A. The bulk portion 106B has a first surface S1 adjacent to the substrate portion 106A and a second surface S2 away from the substrate portion 106A. In other embodiments of the present disclosure, the first conductive-type semiconductor layer 106 may only have a bulk portion 106B and may not have a substrate portion 106A. The bulk portion 106B may be in direct contact with the conductive electrode.

In this embodiment, the first surface S1 is the bottom surface of the bulk portion 106B. In this embodiment, the interface separating the bulk portion 106B and the substrate portion 106A serves as the datum surface of the bottom surface of the bulk portion 106B. The datum surface is substantially parallel to the surface of the substrate portion 106A. In this embodiment, the datum surface is a portion of the surface of substrate portion 106A.

The light-emitting diode 104 may further include a light-emitting layer 108 disposed over the second surface S2 of the bulk portion 106B of the first conductive-type semiconductor layer 106, and a second conductive-type semiconductor layer 110 disposed over the light-emitting layer 108. In other words, the light-emitting layer 108 is disposed between the first conductive-type semiconductor layer 106 and the second conductive-type semiconductor layer 110. The second conductive-type semiconductor layer 110 is adjacent to the substrate 102. In addition, as shown in FIG. 1A, the first surface S1 of the bulk portion 106B of the first conductive-type semiconductor layer 106 is away from the light-emitting layer 108, and the second surface S2 of the bulk portion 106B of the first conductive-type semiconductor layer 106 is adjacent to the light-emitting layer 108. In addition, the second conductive-type semiconductor layer 110 has a third surface S3 adjacent to the light-emitting layer 108 and a fourth surface S4 away from the light-emitting layer 108. In some embodiments of the present disclosure, the area of the first surface S1 is greater than the area of the fourth surface S4. In addition, the bulk portion 106B, the light-emitting layer 108 and the second conductive-type semiconductor layer 110 together serve as a stack structure 112.

The first conductive-type semiconductor layer 106 has the first conductive type. The first conductive-type semiconductor layer 106 may include, but is not limited to, doped $In_xAl_yGa_{(1-x-y)}N$, wherein $0 \leq x \leq 1$, $0 \leq y \leq 1$ and $0 \leq (x+y) \leq 1$. For example, in some embodiments of the present disclosure, the first conductive-type semiconductor layer 106 may include, but is not limited to, doped GaN, InN, AlN, $In_xGa_{(1-x)}N$, $Al_xIn_{(1-x)}N$, $Al_xIn_yGa_{(1-x-y)}N$ or any other suitable materials, wherein $0 \leq x \leq 1$, $0 \leq y \leq 1$ and $0 \leq (x+y) \leq 1$. The first conductive-type semiconductor layer 106 may be a P-type semiconductor layer, and may be formed by molecular beam epitaxy (MBE), metalorganic chemical vapor deposition (MOCVD), hydride vapor phase epitaxy (HVPE), liquid phase epitaxy or any other suitable epitaxy process.

The light-emitting layer 108 may include, but is not limited to, homojunction, heterojunction, single-quantum well (SQW), multiple-quantum well (MQW) or any other suitable structures. In some embodiments of the present disclosure, the light-emitting layer 108 may include undoped N-type $In_xGa_{(1-x)}N$. In some embodiments of the present disclosure, the light-emitting layer 108 may include other materials such as $Al_xIn_yGa_{(1-x-y)}N$. Moreover, the light-emitting layer 108 may include a multiple-quantum well structure with multiple-quantum layers (such as InGaN) and barrier layers (such as GaN) arranged alternately. Moreover, the light-emitting layer 108 may be formed by metalorganic chemical vapor deposition (MOCVD), molecular beam epitaxy (MBE), hydride vapor phase epitaxy (HVPE), liquid phase epitaxy (LPE) or any other suitable chemical vapor deposition process. The total thickness of the light-emitting layer 108 may range from about 5 nm to 200 nm.

The second conductive-type semiconductor layer 110 has the second conductive type which is different from the first conductive type. The second conductive-type semiconductor layer 110 may include, but is not limited to, doped $In_xAl_yGa_{(1-x-y)}N$, wherein $0 \leq x \leq 1$, $0 \leq y \leq 1$ and $0 \leq (x+y) \leq 1$. For example, in some embodiments of the present disclosure, the second conductive-type semiconductor layer 110 may include, but is not limited to, doped GaN, InN, AlN, $In_xGa_{(1-x)}N$, $Al_xIn_yGa_{(1-x-y)}N$ or any other suitable materials, wherein $0 \leq x \leq 1$, $0 \leq y \leq 1$ and $0 \leq (x+y) \leq 1$. The second conductive-type semiconductor layer 110 may be N-type semiconductor layer, and may be formed by molecular beam epitaxy (MBE), metalorganic chemical vapor deposition (MOCVD), hydride vapor phase epitaxy (HVPE), liquid phase epitaxy or any other suitable epitaxy process.

In some embodiments of the present disclosure, a light-emitting material layer and a second conductive-type semiconductor material may be deposited over a first conductive-type semiconductor substrate (not shown), then a etching process is performed to form the substrate portion 106A and the stack structure 112 disposed over the substrate portion 106A and having a trapezoidal cross-section, as shown in FIG. 1A. Therefore, in some embodiments of the present disclosure, the substrate portion 106A and the bulk portion 106B are formed in one piece. However, in other embodiments of the present disclosure, the substrate portion 106A and the bulk portion 106B may not be formed in one piece.

In some embodiments of the present disclosure, as shown in FIG. 1A, the direction perpendicular to the first surface S1 of the bulk portion 106B is the first direction A1. When viewed from a cross-sectional view, the acute angle between the sidewall 112S of the stack structure 112 and the first direction A1 is the angle θ, and the angle θ ranges from about 1 to 89 degrees, for example from about 10 to 85 degrees, or from about 20 to 80 degrees, or from about 30 to 75 degrees, or from about 40 to 70 degrees, or from about 50 to 60 degrees, or from about 5 to 50 degrees according to design requirements.

Still referring to FIG. 1A, the light-emitting diode 104 may further include a first electrode 114A which is electrically connected to the first conductive-type semiconductor layer 106. The light-emitting diode 104 may further include a second electrode 114B which is electrically connected to the second conductive-type semiconductor layer 110. In some embodiments of the present disclosure, the first electrode 114A is disposed over the surface of the substrate portion 106A of the first conductive-type semiconductor layer 106. The second electrode 114B is disposed over the fourth surface S4 of the second conductive-type semiconductor layer 110. In addition, in some embodiments of the present disclosure, the second electrode 114B completely covers the fourth surface S4 of the second conductive-type semiconductor layer 110. In addition, in some embodiments of the present disclosure, the light-emitting diode 104 is bonded to the substrate 102 with the second electrode 114B facing toward the substrate 102. In some embodiments of the present disclosure, the second electrode 114B may partially cover the fourth surface S4 of the second conductive-type semiconductor layer 110 according to design requirements as long as the desired reflection design is achieved.

The material of the first electrode 114A and the second electrode 114B may independently include, but is not limited to, a single layer or multiple layers of nickel, copper, gold, indium tin oxide, indium, tin, titanium, a combination thereof, or any other metal material with good conductivity. In some embodiments of the present disclosure, the first electrode 114A and the second electrode 114B may be formed by chemical vapor deposition (CVD), sputtering, resistive thermal evaporation, electron beam evaporation, or any other suitable method. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

Still referring to FIG. 1A, the light-emitting diode 104 may further include a reflection layer 116 disposed over the sidewall 112S of the stack structure 112. In other words, the reflection layer 116 may be disposed over the sidewall of the first conductive-type semiconductor layer 106 and the sidewall of the second conductive-type semiconductor layer 110 respectively. In other embodiments of the present disclosure, the reflection layer 116 may only be disposed over the sidewall of the bulk portion 106A of the first conductive-type semiconductor layer 106. As long as the reflection layer is disposed over at least some regions of the light-emitting path, the light-emitting shape may be altered or the light-emitting effectiveness may be improved. The reflection layer 116 may be optionally disposed over the substrate portion 106B of the first conductive-type semiconductor layer 106. In some embodiments of the present disclosure, the material of the reflection layer 116 may include metal and may be the same as or similar to that of the first electrode 114A and the second electrode 114B. However, in other embodiments of the present disclosure, the reflection layer 116 may be a Bragg reflection layer, and the material of the reflection layer 116 may be non-metal material or insulating material. For example, in some embodiments of the present disclosure, the material of the reflection layer 116 may be the insulating layer with low index of refraction such as $SiO_2$ or the insulating layer with high index of refraction such as SiN. The index of refraction may be tuned by altering the manufacturing variables or the component ratio, and the material of the reflection layer 116 is not limited to the aforementioned materials.

For example, as shown in FIG. 2A, the reflection layer 116 which serves as the Bragg reflection layer may include a plurality of sub-reflection layers (for example, the sub-reflection layers 116C1, 116C2 and 116C3). Each of the sub-reflection layers (for example, the sub-reflection layers 116C1, 116C2 and 116C3) may sequentially include the reflection layer 116D1 and the reflection layer 116D2 with different index of refraction. In some embodiments of the present disclosure, the thicknesses of the reflection layer 116D1 and the reflection layer 116D2 may be less than or equal to about 0.25 times the optical wavelength (about ¼ the optical wavelength). In addition, in other embodiments of the present disclosure, as shown in FIG. 2B, the reflection layer 116 which serves as the Bragg reflection layer may include a plurality of sub-reflection layers (for example, the sub-reflection layers 116C1 and 116C2). Each of the sub-reflection layers (for example, the sub-reflection layers 116C1 and 116C2) may sequentially include the reflection layer 116D1, the reflection layer 116D2 and the reflection layer 116D3 with different index of refraction. In some embodiments of the present disclosure, the thicknesses of the reflection layer 116D1, the reflection layer 116D2 and the reflection layer 116D3 may be less than or equal to about 0.25 times the optical wavelength (about ¼ the optical wavelength).

Still referring to FIG. 1A, in some embodiments of the present disclosure, the reflection layer 116 is conformally disposed over the sidewall 112S of the stack structure 112. In addition, in some embodiments of the present disclosure, the reflection layer 116 may be in direct contact with the stack structure 112. However, in other embodiments of the present disclosure, the reflection layer 116 may not be in direct contact with the stack structure 112. An insulating layer may be disposed between the reflection layer 116 and the stack structure 112. The material of the insulating layer is not limited.

In addition, in some embodiments of the present disclosure, as shown in FIG. 1A, the reflection layer 116 does not come into contact with the second electrode 114B. In other words, in this embodiment, if the reflection layer 116 is a conductive material, the reflection layer 116 and the second electrode 114B are electrically isolated from each other. However, in other embodiments of the present disclosure, the reflection layer 116 may be in direct contact with the second electrode 114B.

In addition, in some embodiments of the present disclosure, as shown in FIG. 1A, the reflection layer 116A disposed over the sidewall of the bulk portion 106B of the stack structure 112 is not electrically connected to the reflection layer 116B disposed over the sidewall of the second conductive-type semiconductor layer 110. In other words, in this embodiment, if the reflection layer 116 and the reflection layer 116B are made of conductive material, the reflection layer 116A and the reflection layer 116B are electrically isolated from each other.

Still referring to FIG. 1A, the width of the first surface S1 of the bulk portion 106B is width D1, the width of the light-emitting layer 108 is width D2, the width of the fourth surface S4 of the second conductive-type semiconductor layer 110 is the width D3, and the distance from the first surface S1 to the fourth surface S4 is the distance H1, which is also the thickness of the stack structure 112. The distance from the first surface S1 to the light-emitting layer 108 is the distance H2, which is also the height of the light-emitting layer 108 calculated from the first surface S1. The specific ratio R which includes the width D1, the width D2, the distance H1 and the distance H2 fit the following equation 1:

$$R = \frac{(D2 \times H2)}{(D1 \times H1)}.$$  equation 1

Figure 1B:
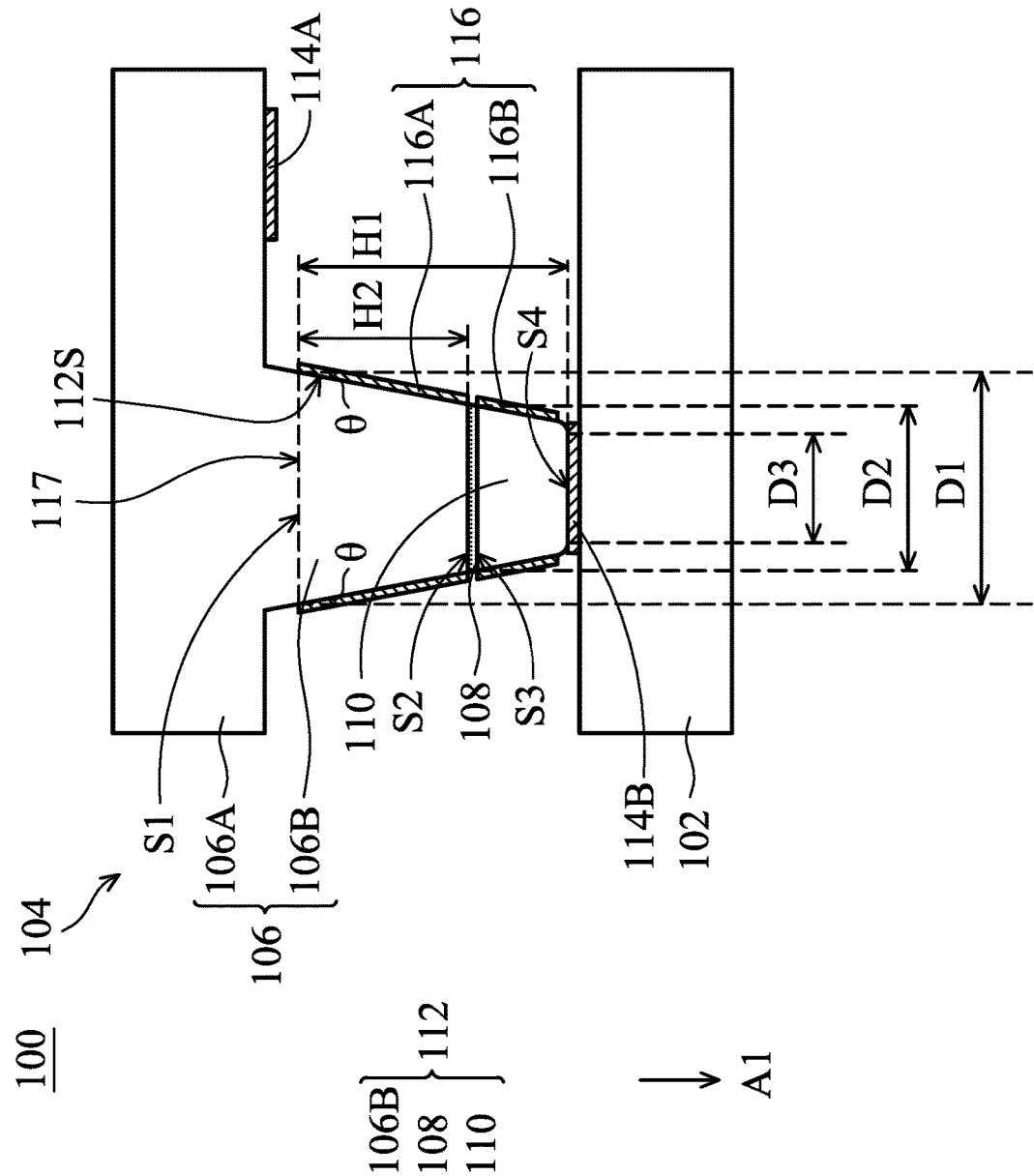
FIG. 1B is a cross-sectional view of a display device in accordance with some embodiments of the present disclosure.

Since some embodiments of the present disclosure let the width D1 of the first surface S1 of the stack structure 112 of the light-emitting diode 104, the width D2 of the light-emitting layer 108, the distance H1 from the first surface S1 to the fourth surface S4 (namely the thickness of the stack structure 112), the distance H2 from the first surface S1 to the light-emitting layer 108 (namely the height of the light-emitting layer 108 calculated from the first surface S1) has a relationship expressed by equation 1, the light-emitting diode display device of some embodiments of the present disclosure may freely alter the light-emitting view angle and the light-emitting shape or may improve the light-emitting effectiveness. In this embodiment, the reflection layer 116 is substantially disposed over the entire sidewall of the stack structure. Since the opening 117 of the reflection layer 116 at the light-emitting direction is the first surface S1, the first surface S1 substantially coincide with the bottom surface of the stack structure. In other embodiments of the present disclosure, the size of the opening at the light-emitting direction is the size of the bottom surface of the reflection layer, and the opening 117 at the light-emitting direction is referred to as the first surface S1, therefore, the first surface S1 may not coincide with the bottom surface of the stack structure. In other words, referring to FIG. 1B, when the reflection layer 116 does not completely cover the entire sidewall 112S of the stack structure 112, the first surface S1 is defined by the datum surface formed by the opening 117 of the reflection layer 116 and may be substantially parallel to the surface of the substrate portion 106A, but it's not limited thereto. In this embodiment, the first surface S1 may not coincide with the bottom surface of the bulk portion 106B.

In addition, since the additional second lens is not needed in the embodiments of the present disclosure to alter the light-emitting view angle and the light-emitting shape, the embodiments of the present disclosure may lower the cost of the light-emitting diode display device 100.

Figure 3:
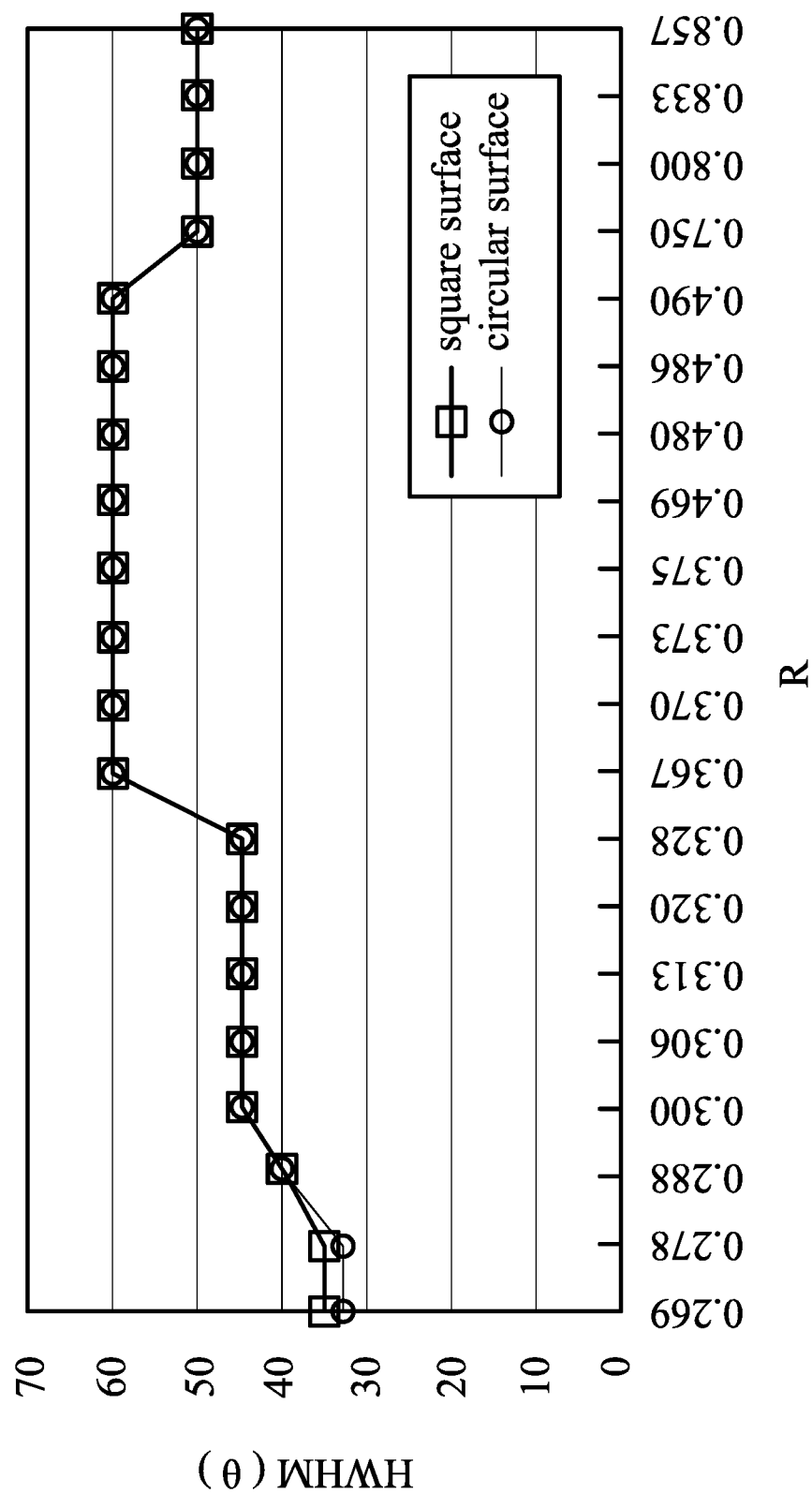
FIG. 3 is an analytical figure of the ratio of specific width and distance in the stack structure versus the half width at half maximum in accordance with some embodiments of the present disclosure.

In one embodiment, FIG. 3 is an analytical figure of the aforementioned specific ratio R versus the half width at half maximum (HWHM) of the emitted light of the display device 100 in accordance with some embodiments of the present disclosure. The line with circle dots shows the relationship between the specific ratio R versus the half width at half maximum of the emitted light of the display device 100 when the first surface S1 and the fourth surface S4 have circular shapes in the top view. The line with square dots shows the relationship between the specific ratio R versus the half width at half maximum of the emitted light of the display device 100 when the first surface S1 and the fourth surface S4 have square shapes in the top view. In this embodiment, the specific ratio R may range from about 0.269 to 0.857 (0.269≤R≤0.857).

As shown in FIG. 3, when the ratio R is greater than or equal to 0.269 and is less than 0.3, the half width at half maximum is greater than or equal to ±30° and is less than ±45°. In this embodiment, the light shape is focus shape, and may be applied to the device which need a straight light such as an indicator light.

When the ratio R is greater than or equal to 0.3 and is less than 0.328, the half width at half maximum is greater than or equal to ±45. In this embodiment, the light shape is focus shape, and may be applied to a device which needs a straight light such as a headlight.

When the ratio R is greater than or equal to 0.328 and is less than 0.375, the half width at half maximum is greater than ±45° and is less than or equal to ±60°. In this embodiment, the light shape is fan-shape, and may be applied to the table lamp which need a uniform light. This embodiment may also solve the issue of non-uniformity of emitted light between two the light-emitting diodes.

When the ratio R is greater than or equal to 0.375 and is less than 0.49, the half width at half maximum is ±60°. In this embodiment, the light shape is between the fan-shape and Gaussian distribution, and may be applied to the table lamp which need a uniform light. This embodiment may also solve the issue of non-uniformity of emitted light between two the light-emitting diodes.

When the ratio R is greater than or equal to 0.49 and is less than 0.857, the half width at half maximum is ±50°. In this embodiment, the light shape is a Gaussian distribution, and may be applied to the package chip such as a surface-mount device light-emitting diode. For example, this embodiment may be applied to an edge lighting light source or a bottom-lighting light source.

Figure 4A:
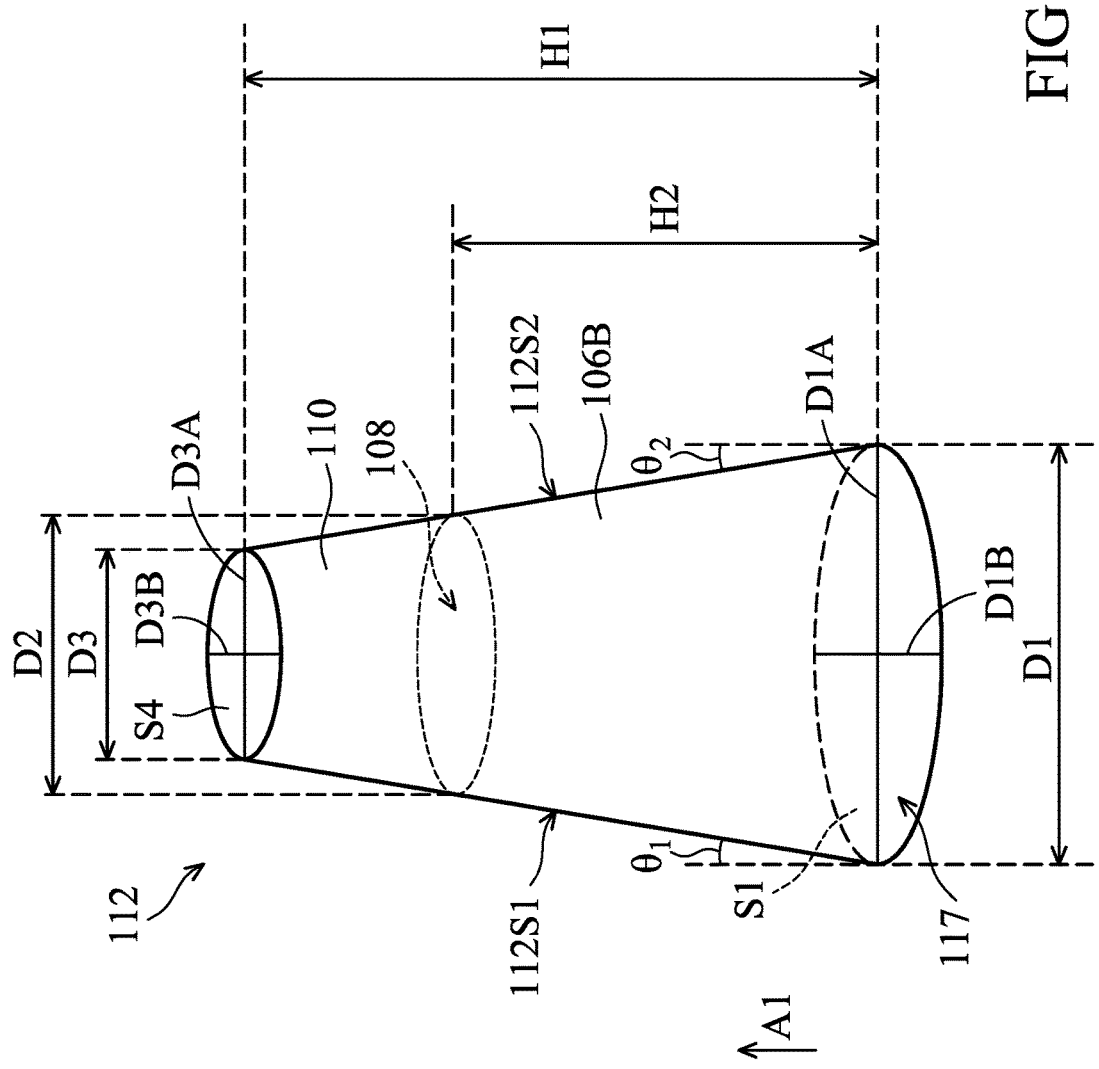
FIG. 4A is a schematic view of the stack structure in accordance with some embodiments of the present disclosure.

In addition, the first surface S1 of the bulk portion 106B and the fourth surface S4 of the second conductive-type semiconductor layer 110 may be any shape. In one embodiment, the shape of the first surface S1 may substantially have a first axis and a second axis which are perpendicular to each other. The shape of the fourth surface S4 may also substantially have a first axis and a second axis which are perpendicular to each other. Although the first surface S1 and fourth surface S4 have a first axis and a second axis, this does not mean that the first surface S1 and fourth surface S4 need to be completely symmetrical. The first surface S1 and fourth surface S4 may only have a substantially corresponding shape. The wires or metal line may be omitted. The deviation resulted from the manufacture variation may also be omitted. In some embodiments of the present disclosure, when the length of the first axis and the length of the second axis are the same, the first surface S1 and the fourth surface S4 may have a symmetrical shape. For example, the first surface S1 and the fourth surface S4 may have a circular shape or a square shape. In other embodiments of the present disclosure, when the length of the first axis and the length of the second axis are different, the first surface S1 and the fourth surface S4 may have a non-symmetrical shape. For example, the first surface S1 and the fourth surface S4 may have an oval shape or a rectangular shape. In this embodiment, if the length of the first axis is greater than the length of the second axis, the first axis may also be referred to as the major axis, and the second axis may also be referred to as the minor axis. In addition, in some embodiments of the present disclosure, the shape of the first surface S1 and the shape of the fourth surface S4 may be the same. However, in other embodiments of the present disclosure, the shape of the first surface S1 and the shape of the fourth surface S4 may be different.

the distance H1, the distance H2, the width D1, the width D2, the width D3, the angle θ(for example, the second angle $\theta_2$ and the first angle $\theta_1$), the specific ratio R and the half width at half maximum of ≳ the emitted light of the light-emitting diode 104 and the light-emitting effectiveness is shown in the following Table 1. In addition, although the first surface S1 and the fourth surface S4 have a first axis and a second axis, this does not mean that the first surface S1 and fourth surface S4 need to be completely symmetrical. The first surface S1 and fourth surface S4 may only have a substantially corresponding shape. The wires or metal line may be omitted. The deviation resulted from the manufacture variation may also be omitted. In table 1, the unit of width and length is um. In addition, in this embodiment, the stack structure 112 has a first sidewall 112S1 and a second sidewall 112S2 which are opposite to each other. And the size of the light-emitting opening of the reflection layer coated on the first sidewall 112S1 and the second sidewall 112S2 is the first surface S1. The direction perpendicular to the first surface S1 and the fourth surface S4 is the direction A1. The acute angle between the first sidewall 112S1 of the stack structure 112 and the direction A1 is the first angle $\theta_1$, the acute angle between the second sidewall 112S2 of the stack structure 112 and the direction A1 is the second angle $\theta_2$. In this embodiment, as shown in FIG. 4A, the second angle $\theta_2$ and the first angle $\theta_1$ are the same.

TABLE 1

| H1 (um) | H2 (um) | D3 (um) | D1 (um) | θ1 = θ2 | D2 (um) | R | Light-emitting effectiveness | HWHM |
|---|---|---|---|---|---|---|---|---|
| 7 | 6 | 1 | 1 | 0° | 1 | 0.857 | 2.95 lm | 5.9% | 50° |
|  |  |  | 2 | 4.09° | 1.14 | 0.490 | 12.23 lm | 24.5% | 60° |
|  |  |  | 3 | 8.13° | 1.29 | 0.367 | 25.55 lm | 51.1% | 60° |
|  |  |  | 4 | 12.09° | 1.43 | 0.306 | 30.20 lm | 60.4% | 45° |
|  |  |  | 5 | 15.95° | 1.57 | 0.269 | 31.63 lm | 63.3% | 33° |
| 6 | 5 | 1 | 1 | 0° | 1 | 0.833 | 3.06 lm | 6.1% | 50° |
|  |  |  | 2 | 4.76° | 1.17 | 0.486 | 12.65 lm | 25.3% | 60° |
|  |  |  | 3 | 9.46° | 1.33 | 0.370 | 25.64 lm | 51.3% | 60° |
|  |  |  | 4 | 14.04° | 1.50 | 0.313 | 29.85 lm | 59.7% | 45° |
|  |  |  | 5 | 18.43° | 1.67 | 0.278 | 31.01 lm | 62% | 33° |
| 5 | 4 | 1 | 1 | 0° | 1 | 0.8 | 3.17 lm | 6.3% | 50° |
|  |  |  | 2 | 5.71° | 1.2 | 0.48 | 12.98 lm | 26% | 60° |
|  |  |  | 3 | 11.31° | 1.4 | 0.373 | 25.52 lm | 51% | 60° |
|  |  |  | 4 | 16.7° | 1.6 | 0.32 | 29.58 lm | 59.2% | 45° |
|  |  |  | 5 | 21.8° | 1.8 | 0.288 | 30.67 lm | 61.3% | 40° |
| 4 | 3 | 1 | 1 | 0° | 1 | 0.75 | 3.3 lm | 6.6% | 50° |
|  |  |  | 2 | 7.13° | 1.25 | 0.469 | 13.5 lm | 27% | 60° |
|  |  |  | 3 | 14.04° | 1.5 | 0.375 | 24.96 lm | 49.9% | 60° |
|  |  |  | 4 | 20.56° | 1.75 | 0.328 | 27.64 lm | 55.3% | 45° |
|  |  |  | 5 | 26.57° | 2 | 0.3 | 28.67 lm | 57.3% | 45° |
| 3 | 2 | 1 | 1 | 0° | 1 | 0.667 | 3.44 lm | 6.9% | 50° |
|  |  |  | 2 | 9.46° | 1.33 | 0.444 | 13.93 lm | 27.9% | 60° |
|  |  |  | 3 | 18.43° | 1.67 | 0.37 | 23.81 lm | 47.6% | 55° |
|  |  |  | 4 | 26.57° | 2 | 0.333 | 26.39 lm | 52.8% | 45° |
|  |  |  | 5 | 33.69° | 2.33 | 0.311 | 29.79 lm | 59.6% | 60° |

Figure 4B:
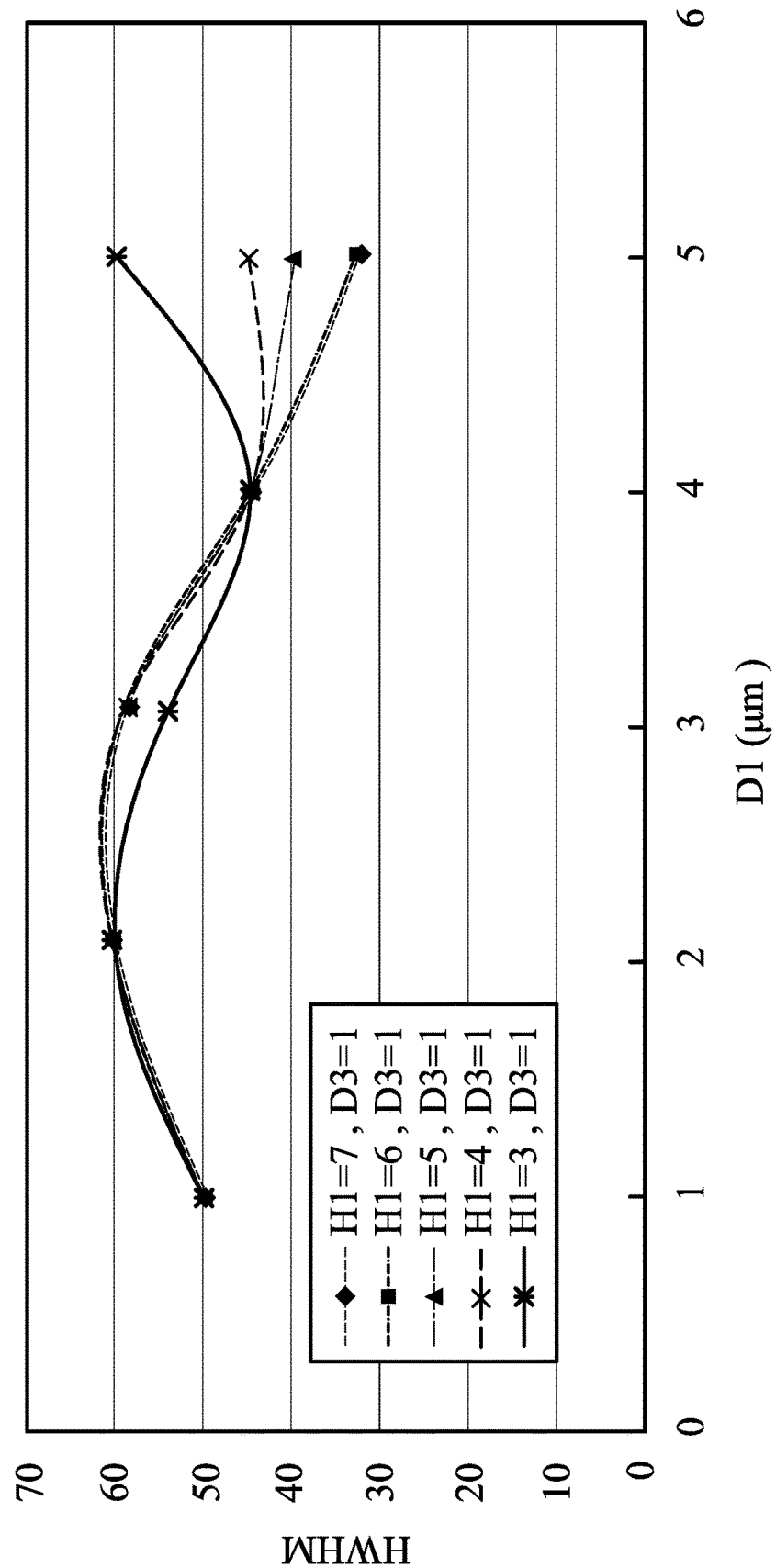
FIG. 4B is an analytical figure of the width of the bottom surface of the stack structure versus the half width at half maximum in accordance with some embodiments of the present disclosure.
Figure 4E:
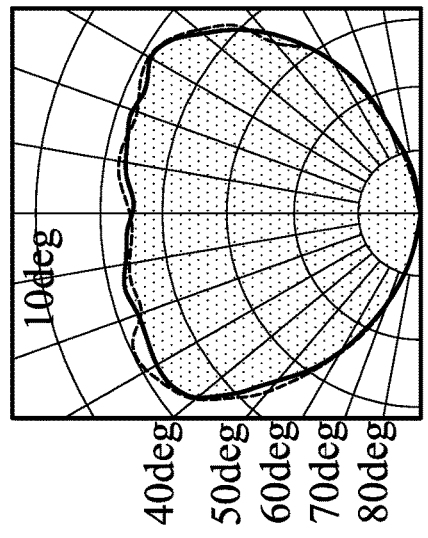
FIG. 4E is a distribution figure of the emitted light at various view angles in accordance with some embodiments of the present disclosure.
Figure 4D:
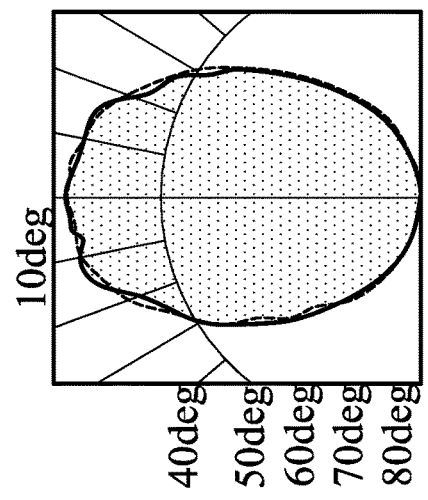
FIG. 4D is a distribution figure of the emitted light at various view angles in accordance with some embodiments of the present disclosure.
Figure 4C:
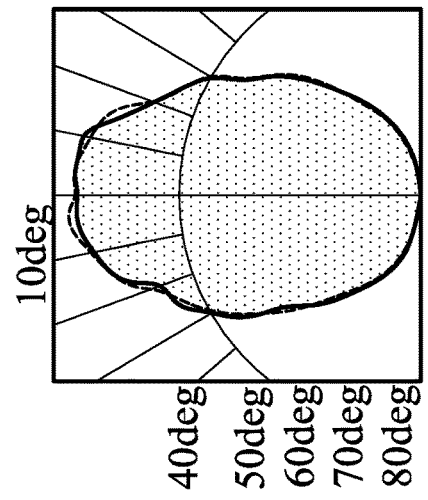
FIG. 4C is a distribution figure of the emitted light at various view angles in accordance with some embodiments of the present disclosure.
Figure 4G:
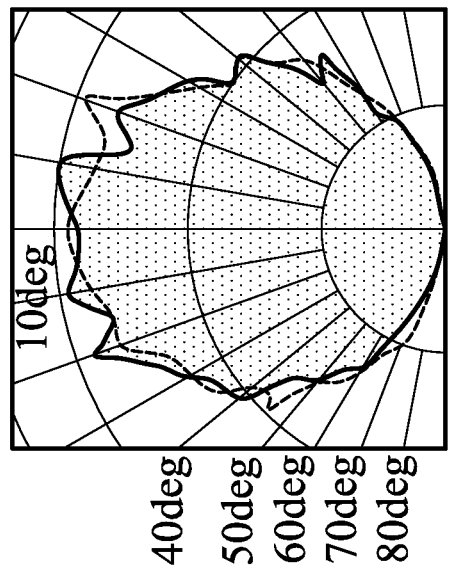
FIG. 4G is a distribution figure of the emitted light at various view angles in accordance with some embodiments of the present disclosure.
Figure 4F:
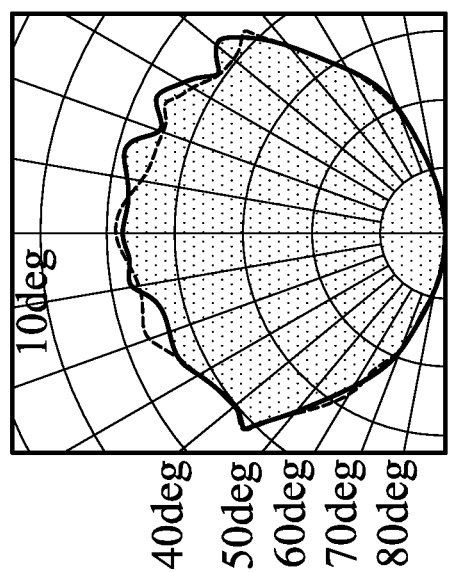
FIG. 4F is a distribution figure of the emitted light at various view angles in accordance with some embodiments of the present disclosure.

The relationship between the specific width, the distance, the ratio of the stack structure and the half width at half maximum when the first surface S1 and the fourth surface S4 have various shapes is described as follows. FIG. 4A is a schematic view of the stack structure 112 in accordance with some embodiments of the present disclosure. As shown in FIG. 4A, in some embodiments of the present disclosure, the distance of the first axis D1A of the first surface S1 is the same as the distance of the second axis D1B of the first surface S1 (both are the width D1). In addition, the distance of the first axis D3A of the fourth surface S4 is the same as the distance of the second axis D3B of the fourth surface S4 (both are the width D3). The first surface S1 and the fourth surface S4 have a circular shape. The relationship between In addition, FIG. 4B is an analytical figure of the width D1 of the first surface S1 of the stack structure 112 (or the bottom surface of the stack structure 112) versus the half width at half maximum in accordance with this embodiment of the present disclosure, which corresponds to the data shown in Table 1. In this embodiment, the ratio R may range from about 0.269 to 0.857 (0.269≤R≤0.857). In addition, FIG. 4C is a distribution figure of the emitted light at various view angles in accordance with this embodiment of the present disclosure when the ratio R is greater than or equal to 0.269 and is less than 0.3. In FIG. 4C, the half width at half maximum is ±30°. In addition, FIG. 4D is a distribution figure of the emitted light at various view angles in accordance with this embodiment of the present disclosure when the ratio R is greater than or equal to 0.3 and is less than 0.328. In FIG. 4D, the half width at half maximum is ±40°. In addition, FIG. 4E is a distribution figure of the emitted light at various view angles in accordance with this embodiment of the present disclosure when the ratio R is greater than or equal to 0.328 and is less than 0.375. In FIG. 4E, the half width at half maximum is ±60°. In addition, FIG. 4F is a distribution figure of the emitted light at various view angles in accordance with this embodiment of the present disclosure when the ratio R is greater than or equal to 0.375 and is less than 0.49. In FIG. 4F, the half width at half maximum is ±60°. In addition, FIG. 4G is a distribution figure of the emitted light at various view angles in accordance with this embodiment of the present disclosure when the ratio R is greater than or equal to 0.49 and is less than 0.857. In FIG. 4G, the half width at half maximum is ±50°. In addition, in the above figures, the solid line represents the distribution figure of the emitted light at various view angles along the direction of the first axis, and the dash line represents the distribution figure of the emitted light at various view angles along the direction of the second axis. Since the length of the first axis is the same as the length of the second axis in this embodiment, the solid line substantially overlaps with the dash line.

Therefore, by tuning the ratio R which ranges from about 0.269 to 0.857, the light-emitting diode display device of some embodiments of the present disclosure may alter the light-emitting view angle and the light-emitting shape freely.

In addition, when the distance H1 is 3 μm, the half width at half maximum in FIG. 4B increases. This is because the height of the stack structure 112 becomes too small when the distance H1 is 3 μm, and most light is emitted from the stack structure 112 without being reflected by the sidewall of the stack structure 112. Since most light is not reflected and focused by reflection by the sidewall of the stack structure 112, the half width at half maximum increases. Therefore, the lower limit of the distance H1 in FIG. 4B is 3 μm.

Figure 5A:
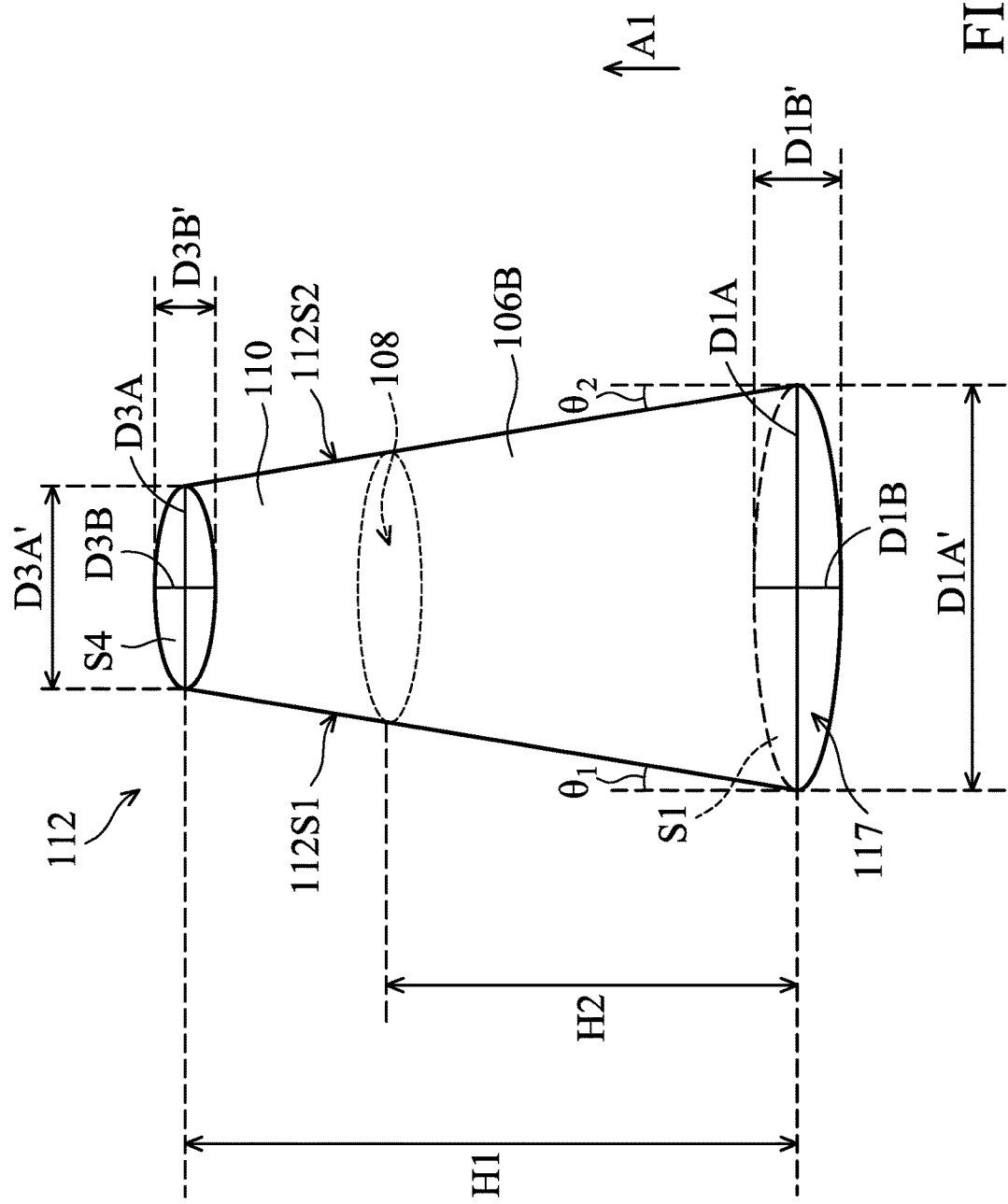
FIG. 5A is a schematic view of the stack structure in accordance with some embodiments of the present disclosure.

FIG. 5A is a schematic view of the stack structure 112 in accordance with some embodiments of the present disclosure. As shown in FIG. 5A, in some embodiments of the present disclosure, the distance of the first axis D1A (also referred to as the major axis D1A) of the first surface S1 is greater than the distance of the second axis D1B (also referred to as the minor axis D1B). In addition, the distance of the first axis D3A (also referred to as the major axis D3A) of the fourth surface S4 is greater than the distance of the second axis D3B (also referred to as the minor axis D3B). The first surface S1 and the fourth surface S4 have an oval shape. The relationship between the distance H1, the distance H2, the distance D3A' of the major axis D3A, the distance D3B' of the minor axis D3B, the distance D1A' of the major axis D1A, the distance D1B' of the minor axis D1B and the light-emitting effectiveness of the light-emitting diode 104, the half width at half maximum A of the emitted light along the direction of the major axis and the half width at half maximum B of the emitted light along the direction of the minor axis is shown in the following Table 2. In addition, although the first surface S1 and fourth surface S4 have the first axis and the second axis, this does not mean that the first surface S1 and fourth surface S4 need to be completely symmetrical. The first surface S1 and fourth surface S4 may only have a substantially corresponding shape. The wires or metal line may be omitted. The deviation resulted from the manufacture variation may also be omitted. In addition, in this embodiment, the stack structure 112 has a first sidewall 112S1 and a second sidewall 112S2 which are opposite to each other. And the size of the light-emitting opening 117 of the reflection layer coated on the first sidewall 112S1 and the second sidewall 112S2 is the first surface S1. The direction perpendicular to the first surface S1 and the fourth surface S4 is the direction A1. The acute angle between the first sidewall 112S1 of the stack structure 112 and the direction A1 is the first angle $\theta_1$, the acute angle between the second sidewall 112S2 of the stack structure 112 and the direction A1 is the second angle $\theta_2$. In this embodiment, as shown in FIG. 5A, the second angle $\theta_2$ and the first angle $\theta_1$ are the same.

TABLE 2

| H1 (um) | H2 (um) | D3A' (um) | D3B' (um) | D1A' (um) | D1B' (um) | Light-emitting effectiveness | | HWHM A | HWHM B |
|---|---|---|---|---|---|---|---|---|---|
| 7 | 6 | 1 | 0.5 | 1 | 0.50 | 2.61 lm | 0.052% | 35° | 35° |
| | | | | 2 | 1.00 | 10.34 lm | 0.207% | 50° | 50° |
| | | | | 3 | 1.50 | 22.04 lm | 0.441% | 55° | 60° |
| | | | | 4 | 2.00 | 27.35 lm | 0.547% | 45° | 48° |
| | | | | 5 | 2.50 | 29.26 lm | 0.585% | 38° | 35° |
| 6 | 5 | 1 | 0.5 | 1 | 0.50 | 2.78 lm | 0.056% | 40° | 40° |
| | | | | 2 | 1.00 | 10.85 lm | 0.217% | 55° | 55° |
| | | | | 3 | 1.50 | 22.49 lm | 0.450% | 55° | 60° |
| | | | | 4 | 2.00 | 27.38 lm | 0.548% | 45° | 45° |
| | | | | 5 | 2.50 | 29.13 lm | 0.583% | 40° | 35° |
| 5 | 4 | 1 | 0.5 | 1 | 0.50 | 2.99 lm | 0.060% | 45° | 45° |
| | | | | 2 | 1.00 | 11.34 lm | 0.227% | 55° | 55° |
| | | | | 3 | 1.50 | 22.34 lm | 0.447% | 55° | 60° |
| | | | | 4 | 2.00 | 26.74 lm | 0.535% | 45° | 45° |
| | | | | 5 | 2.50 | 28.10 lm | 0.562% | 40° | 35° |
| 4 | 3 | 1 | 0.5 | 1 | 0.50 | 3.23 lm | 0.065% | 50° | 50° |
| | | | | 2 | 1.00 | 11.91 lm | 0.238% | 60° | 60° |
| | | | | 3 | 1.50 | 21.74 lm | 0.435% | 55° | 60° |
| | | | | 4 | 2.00 | 25.94 lm | 0.519% | 50° | 45° |
| | | | | 5 | 2.50 | 26.92 lm | 0.538% | 45° | 40° |
| 3 | 2 | 1 | 0.5 | 1 | 0.50 | 3.58 lm | 0.072% | 55° | 55° |
| | | | | 2 | 1.00 | 12.31 lm | 0.246% | 65° | 65° |
| | | | | 3 | 1.50 | 21.18 lm | 0.424% | 55° | 65° |
| | | | | 4 | 2.00 | 24.46 lm | 0.489% | 50° | 50° |
| | | | | 5 | 2.50 | 25.25 lm | 0.505% | 50° | 40° |

Figure 5B:
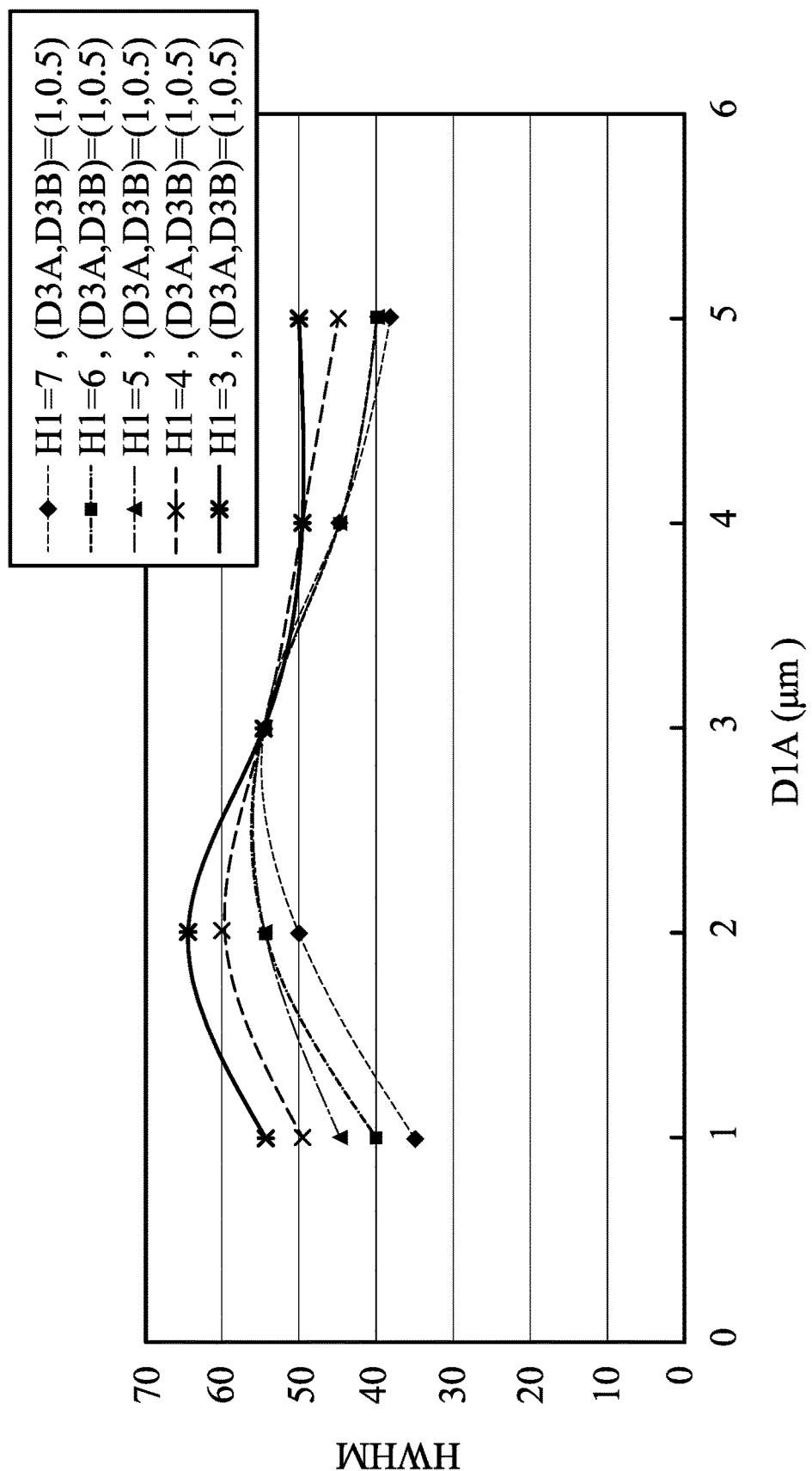
FIG. 5B is an analytical figure of the width of the major axis at the bottom surface of the stack structure versus the half width at half maximum in accordance with some embodiments of the present disclosure.
Figure 5C:
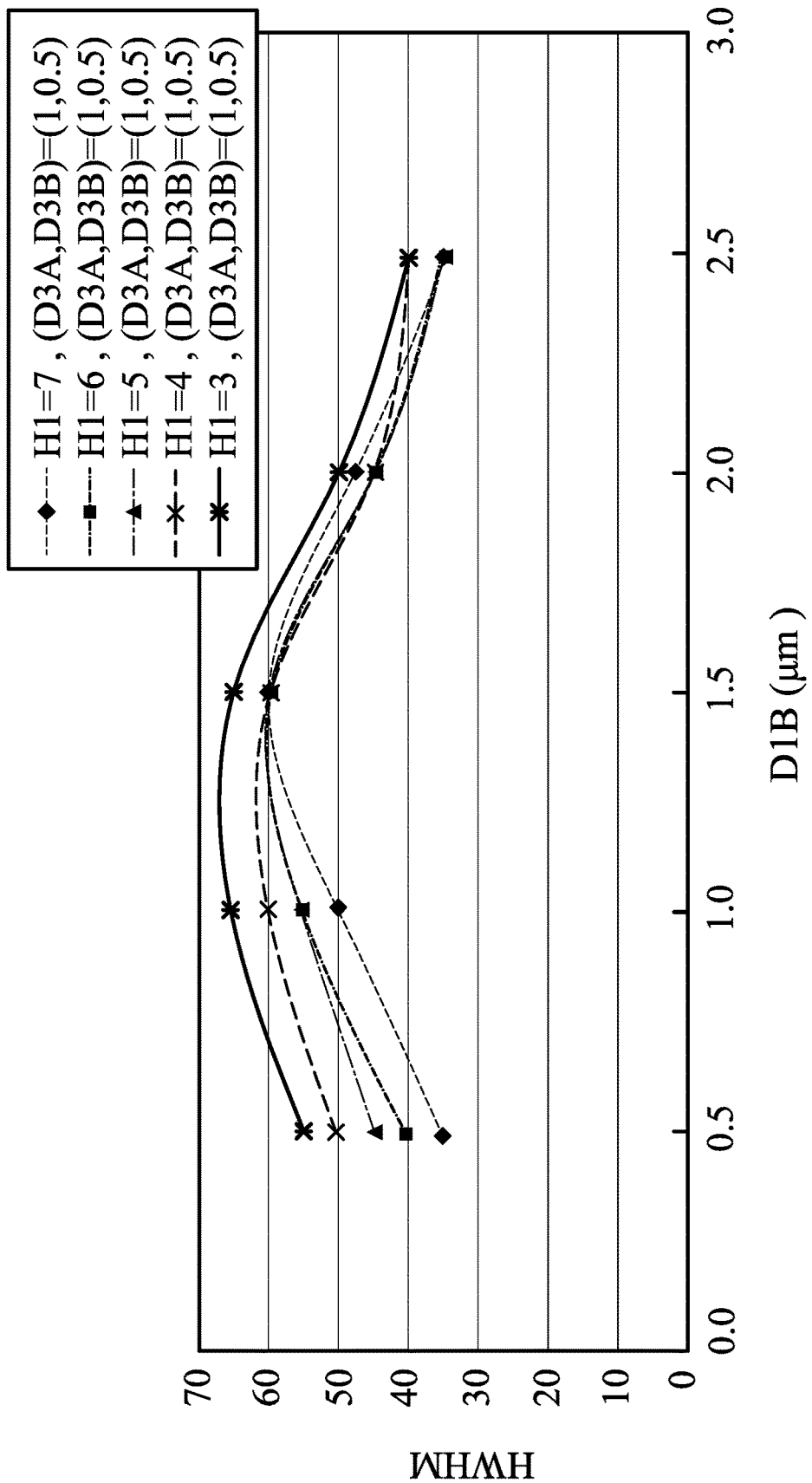
FIG. 5C is an analytical figure of the width of the minor axis at the bottom surface of the stack structure versus the half width at half maximum in accordance with some embodiments of the present disclosure.

In addition, FIG. 5B is an analytical figure of the distance MA of the major axis of the first surface S1 of the stack structure 112 (or the bottom surface of the stack structure 112) versus the half width at half maximum in accordance with this embodiment of the present disclosure. FIG. 5C is an analytical figure of the distance D1B of the minor axis of the first surface S1 of the stack structure 112 (or the bottom surface of the stack structure 112) versus the half width at half maximum in accordance with this embodiment of the present disclosure. The results shown in FIG. 5B and FIG. 5C correspond to the data shown in Table 2.

Referring to FIGS. 5D-5H, the solid line in FIGS. 5D-5H represents the distribution figure of the emitted light at various view angles along the direction of the major axis, and the dash line in FIGS. 5D-5H represents the distribution figure of the emitted light at various view angles along the direction of the minor axis. FIG. 5D is a distribution figure of the emitted light at various view angles in accordance with this embodiment of the present disclosure when the distance of the major axis MA of the first surface S1 is 1 μm, the distance of the minor axis D1B of the first surface S1 is 0.5 μm, the distance of the major axis D3A of the fourth surface S4 is 1 μm, the distance of the minor axis D3B of the fourth surface S4 is 0.5 μm, the distance H1 is 7 μm and the distance H2 is 6 μm.

In addition, FIG. 5E is a distribution figure of the emitted light at various view angles in accordance with this embodiment of the present disclosure when the distance of the major axis MA of the first surface S1 is 2 μm, the distance of the minor axis D1B of the first surface S1 is 1 μm, the distance of the major axis D3A of the fourth surface S4 is 1 μm, the distance of the minor axis D3B of the fourth surface S4 is 0.5 μm, the distance H1 is 7 μm and the distance H2 is 6 μm.

FIG. 5F is a distribution figure of the emitted light at various view angles in accordance with this embodiment of the present disclosure when the distance of the major axis D1A of the first surface S1 is 3 μm, the distance of the minor axis D1B of the first surface S1 is 1.5 μm, the distance of the major axis D3A of the fourth surface S4 is 1 μm, the distance of the minor axis D3B of the fourth surface S4 is 0.5 μm, the distance H1 is 7 μm and the distance H2 is 6 μm.

Figure 5H:
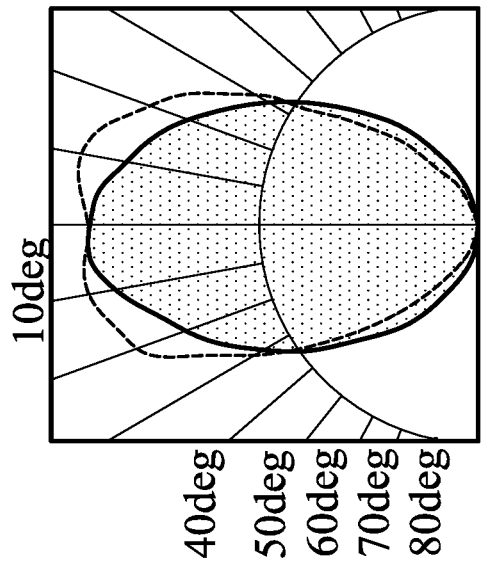
FIG. 5H is a distribution figure of the emitted light at various view angles in accordance with some embodiments of the present disclosure.
Figure 5G:
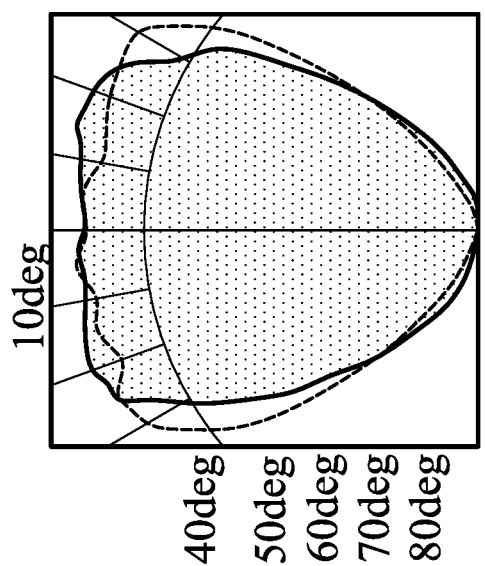
FIG. 5G is a distribution figure of the emitted light at various view angles in accordance with some embodiments of the present disclosure.

FIG. 5G is a distribution figure of the emitted light at various view angles in accordance with this embodiment of the present disclosure when the distance of the major axis D1A of the first surface S1 is 4 μm, the distance of the minor axis D1B of the first surface S1 is 2 μm, the distance of the major axis D3A of the fourth surface S4 is 1 μm, the distance of the minor axis D3B of the fourth surface S4 is 0.5 μm, the distance H1 is 7 μm and the distance H2 is 6 μm.

FIG. 5H is a distribution figure of the emitted light at various view angles in accordance with this embodiment of the present disclosure when the distance of the major axis D1A of the first surface S1 is 5 μm, the distance of the minor axis D1B of the first surface S1 is 2.5 μm, the distance of the major axis D3A of the fourth surface S4 is 1 μm, the distance of the minor axis D3B of the fourth surface S4 is 0.5 μm, the distance H1 is 7 μm and the distance H2 is 6 μm.

Therefore, by tuning the distance of the major axis of the first surface and the distance of the minor axis of the first surface, the light-emitting diode display device of some embodiments of the present disclosure may alter the light-emitting view angle and the light-emitting shape freely.

Figure 6A:
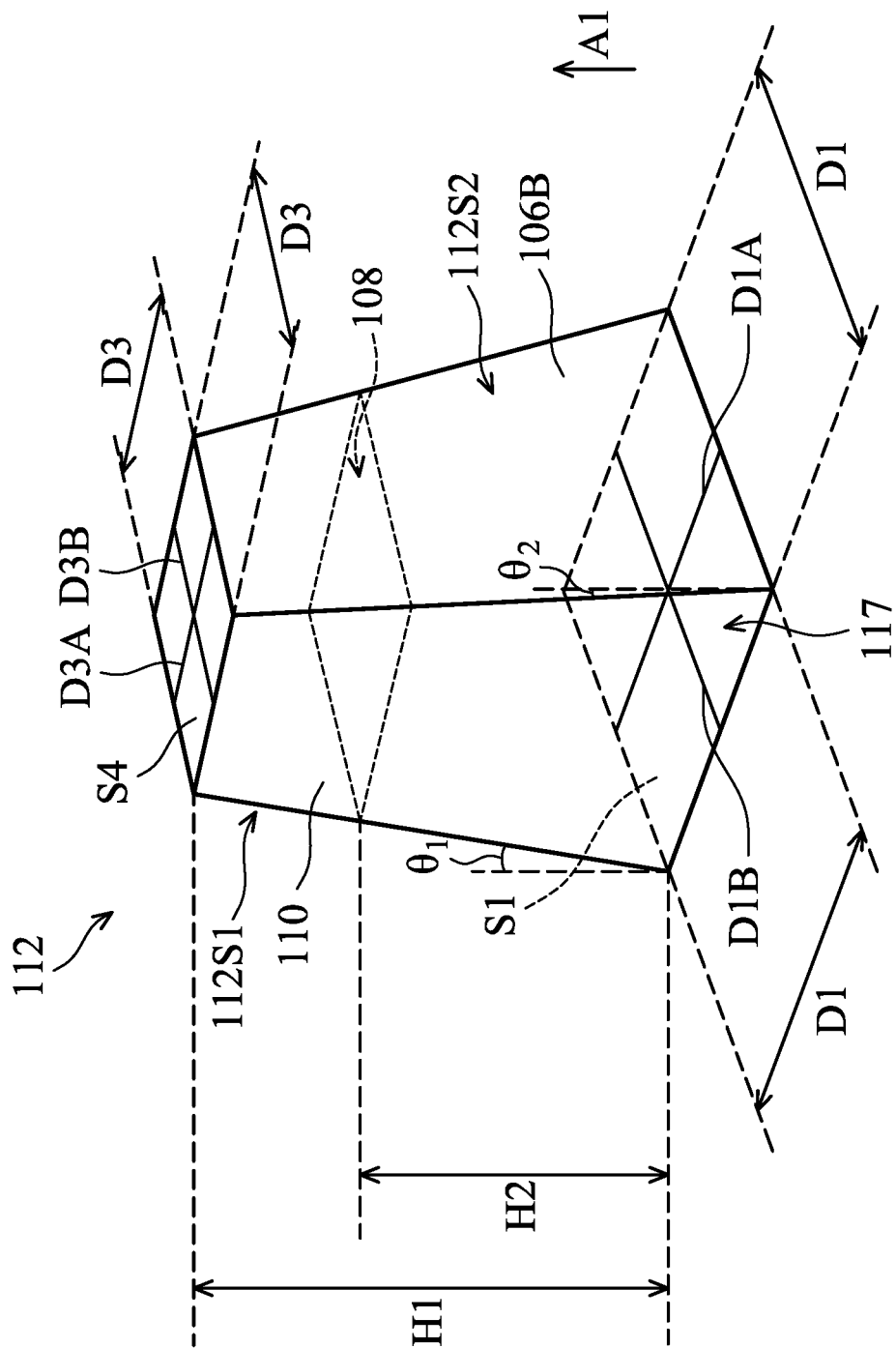
FIG. 6A is a schematic view of the stack structure in accordance with some embodiments of the present disclosure.

FIG. 6A is a schematic view of the stack structure 112 in accordance with some embodiments of the present disclosure. As shown in FIG. 6A, in some embodiments of the present disclosure, the distance of the first axis D1A of the first surface S1 is the same as the distance of the second axis D1B of the first surface S1 (both are the width D1). In addition, the distance of the first axis D3A of the fourth surface S4 is the same as the distance of the second axis D3B of the fourth surface S4 (both are the width D3). The first surface S1 and the fourth surface S4 have a square shape. The relationship between the distance H1, the distance H2, the width D1, the width D2, the width D3, the angle θ (for example, the second angle $\theta_2$ and the first angle $\theta_1$), the specific ratio R and the half width at half maximum of the emitted light of the light-emitting diode 104 and the light-emitting effectiveness is shown in the following Table 3. In addition, although the first surface S1 and fourth surface S4 have a first axis and a second axis, this does not mean that the first surface S1 and fourth surface S4 need to be completely symmetrical. The first surface S1 and fourth surface S4 may only have a substantially corresponding shape. The wires or metal line may be omitted. The deviation resulted from the manufacture variation may also be omitted. In addition, in this embodiment, the stack structure 112 has a first sidewall 112S1 and a second sidewall 112S2 which are opposite to each other. And the size of the light-emitting opening 117 of the reflection layer coated on the first sidewall 112S1 and the second sidewall 112S2 is the first surface S1. The direction perpendicular to the first surface S1 and the fourth surface S4 is the direction A1. The acute angle between the first sidewall 112S1 of the stack structure 112 and the direction A1 is the first angle $\theta_1$, the acute angle between the second sidewall 112S2 of the stack structure 112 and the direction A1 is the second angle $\theta_2$. In this embodiment, as shown in FIG. 6A, the second angle $\theta_2$ and the first angle $\theta_1$ are the same.

TABLE 3

| H1 (um) | H2 (um) | D3 (um) | D1 (um) | θ1 = θ2 | D2 (um) | R | Light-emitting effectiveness | | HWHM |
|---|---|---|---|---|---|---|---|---|---|
| 7 | 6 | 1 | 1 | 0.00° | 1.00 | 0.857 | 2.94 lm | 5.87% | 50° |
|   |   |   | 2 | 4.09° | 1.14 | 0.490 | 12.17 lm | 24.35% | 60° |
|   |   |   | 3 | 8.13° | 1.29 | 0.367 | 24.59 lm | 49.17% | 60° |
|   |   |   | 4 | 12.09° | 1.43 | 0.306 | 28.43 lm | 56.87% | 45° |
|   |   |   | 5 | 15.95° | 1.57 | 0.269 | 29.41 lm | 58.82% | 35° |
| 6 | 5 | 1 | 1 | 0.00° | 1.00 | 0.833 | 3.04 lm | 6.08% | 50° |
|   |   |   | 2 | 4.76° | 1.17 | 0.486 | 12.62 lm | 25.24% | 60° |
|   |   |   | 3 | 9.46° | 1.33 | 0.370 | 24.46 lm | 48.92% | 60° |
|   |   |   | 4 | 14.04° | 1.50 | 0.313 | 27.72 lm | 55.45% | 45° |
|   |   |   | 5 | 18.43° | 1.67 | 0.278 | 28.40 lm | 56.80% | 35° |
| 5 | 4 | 1 | 1 | 0.00° | 1.00 | 0.800 | 3.17 lm | 6.34% | 50° |
|   |   |   | 2 | 5.71° | 1.20 | 0.480 | 12.95 lm | 25.90% | 60° |
|   |   |   | 3 | 11.31° | 1.40 | 0.373 | 24.02 lm | 48.03% | 60° |

TABLE 3-continued

| H1 (um) | H2 (um) | D3 (um) | D1 (um) | θ1 = θ2 | D2 (um) | R | Light-emitting effectiveness | | HWHM |
|---|---|---|---|---|---|---|---|---|---|
| | | | 4 | 16.70° | 1.60 | 0.320 | 26.96 lm | 53.91% | 45° |
| | | | 5 | 21.80° | 1.80 | 0.288 | 27.14 lm | 54.27% | 40° |
| 4 | 3 | 1 | 1 | 0.00° | 1.00 | 0.750 | 3.29 lm | 6.58% | 50° |
| | | | 2 | 7.13° | 1.25 | 0.469 | 13.54 lm | 27.08% | 60° |
| | | | 3 | 14.04° | 1.50 | 0.375 | 23.18 lm | 46.36% | 60° |
| | | | 4 | 20.56° | 1.75 | 0.328 | 25.34 lm | 50.67% | 45° |
| | | | 5 | 26.57° | 2.00 | 0.300 | 25.18 lm | 50.36% | 45° |
| 3 | 2 | 1 | 1 | 0.00° | 1.00 | 0.667 | 3.44 lm | 6.88% | 50° |
| | | | 2 | 9.46° | 1.33 | 0.444 | 13.78 lm | 27.57% | 60° |
| | | | 3 | 18.43° | 1.67 | 0.370 | 22.38 lm | 44.77% | 50° |
| | | | 4 | 26.57° | 2.00 | 0.333 | 23.92 lm | 47.83% | 50° |
| | | | 5 | 33.69° | 2.33 | 0.311 | 27.81 lm | 55.61% | 60° |

Figure 6B:
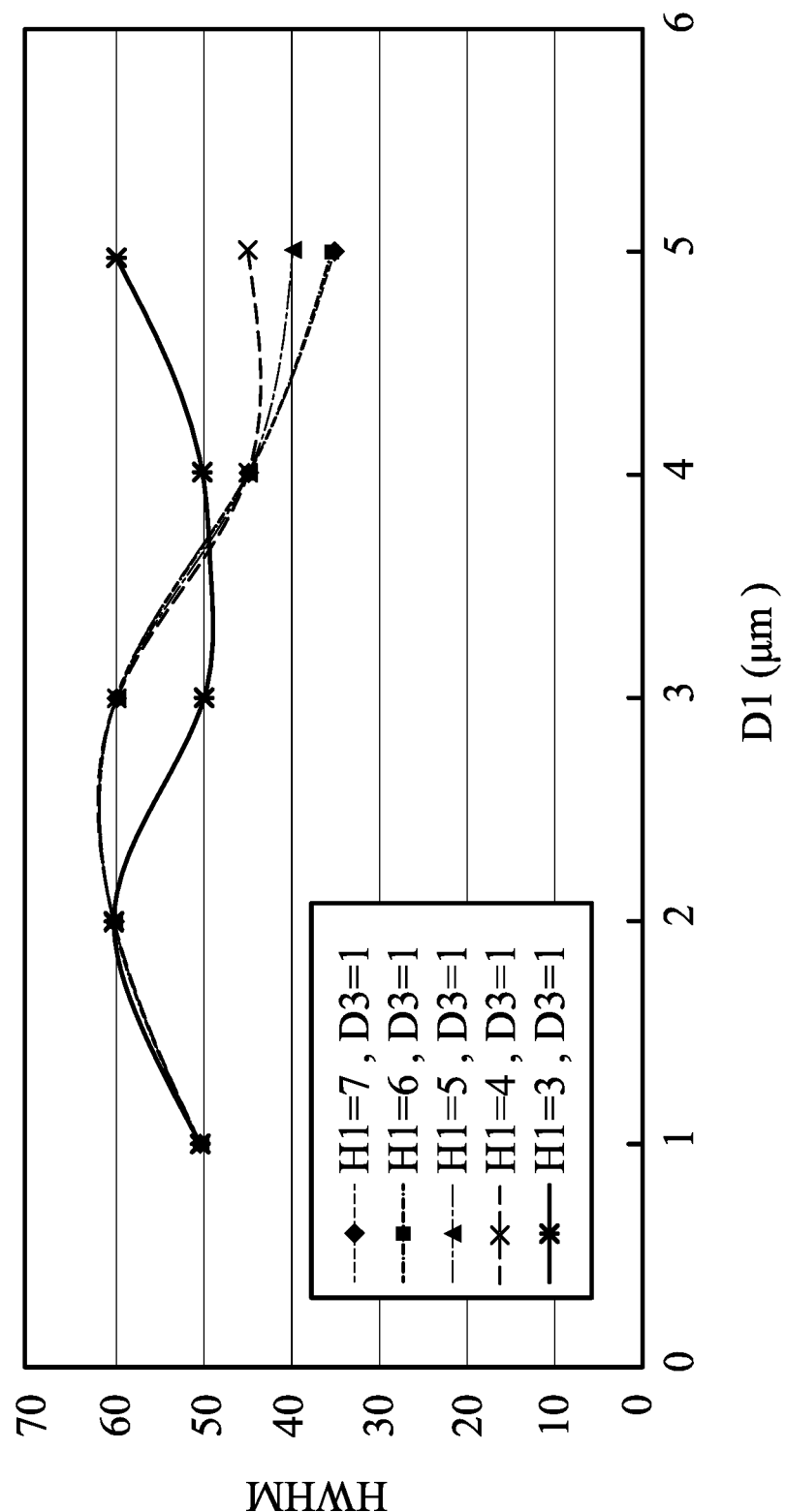
FIG. 6B is an analytical figure of the width of the bottom surface of the stack structure versus the half width at half maximum in accordance with some embodiments of the present disclosure.
Figure 6E:
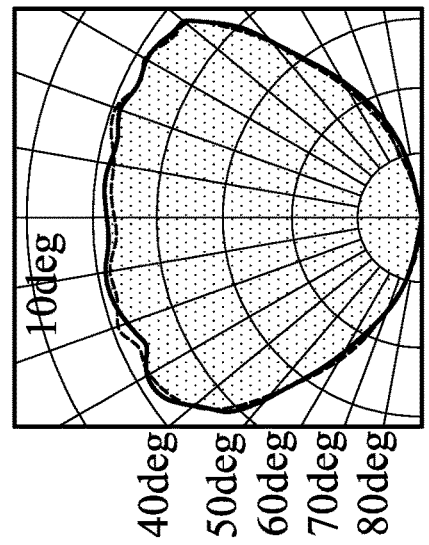
FIG. 6E is a distribution figure of the emitted light at various view angles in accordance with some embodiments of the present disclosure.
Figure 6D:
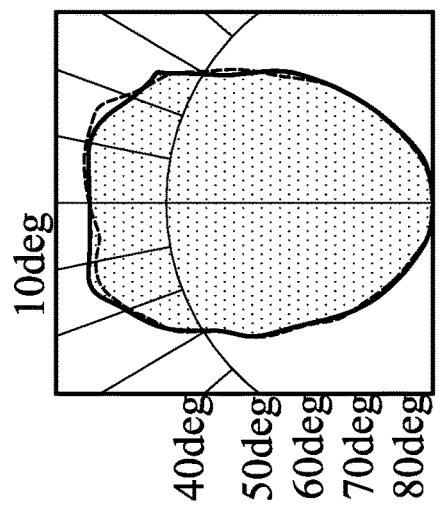
FIG. 6D is a distribution figure of the emitted light at various view angles in accordance with some embodiments of the present disclosure.
Figure 6C:
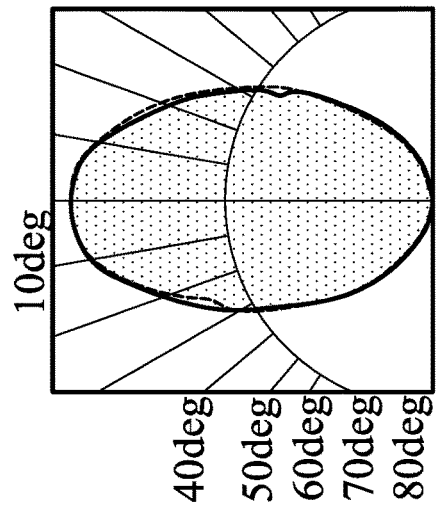
FIG. 6C is a distribution figure of the emitted light at various view angles in accordance with some embodiments of the present disclosure.
Figure 6G:
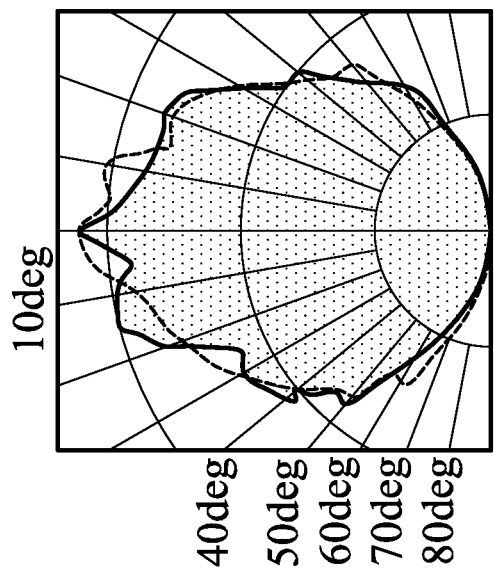
FIG. 6G is a distribution figure of the emitted light at various view angles in accordance with some embodiments of the present disclosure.
Figure 6F:
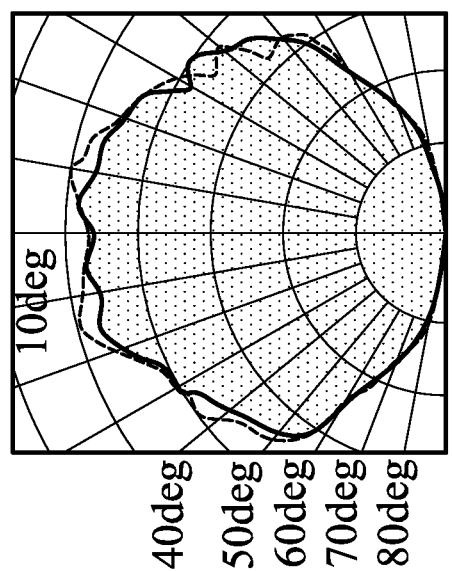
FIG. 6F is a distribution figure of the emitted light at various view angles in accordance with some embodiments of the present disclosure.

In addition, FIG. 6B is an analytical figure of the width D1 of the first surface S1 of the stack structure 112 (or the bottom surface of the stack structure 112) versus the half width at half maximum in accordance with this embodiment of the present disclosure, which corresponds to the data shown in Table 3. In this embodiment, the ratio R may range from about 0.269 to 0.857 (0.269≤R≤0.857). In addition, FIG. 6C is a distribution figure of the emitted light at various view angles in accordance with this embodiment of the present disclosure when the ratio R is greater than or equal to 0.269 and is less than 0.3. In FIG. 6C, the half width at half maximum is ±30°. In addition, FIG. 6D is a distribution figure of the emitted light at various view angles in accordance with this embodiment of the present disclosure when the ratio R is greater than or equal to 0.3 and is less than 0.328. In FIG. 6D, the half width at half maximum is ±40°. In addition, FIG. 6E is a distribution figure of the emitted light at various view angles in accordance with this embodiment of the present disclosure when the ratio R is greater than or equal to 0.328 and is less than 0.375. In FIG. 6E, the half width at half maximum is ±60°. In addition, FIG. 6F is a distribution figure of the emitted light at various view angles in accordance with this embodiment of the present disclosure when the ratio R is greater than or equal to 0.375 and is less than 0.49. In FIG. 6F, the half width at half maximum is ±60°. In addition, FIG. 6G is a distribution figure of the emitted light at various view angles in accordance with this embodiment of the present disclosure when the ratio R is greater than or equal to 0.49 and is less than 0.857. In FIG. 6G, the half width at half maximum is ±50°.

In addition, in the above figures, the solid line represents the distribution figure of the emitted light at various view angles along the direction of the first axis, and the dash line represents the distribution figure of the emitted light at various view angles along the direction of the second axis. Since the length of the first axis is the same as the length of the second axis in this embodiment, the solid line substantially overlaps with the dash line.

Therefore, by tuning the ratio R which ranges from about 0.269 to 0.857, the light-emitting diode display device of some embodiments of the present disclosure may alter the light-emitting view angle and the light-emitting shape freely.

Figure 7A:
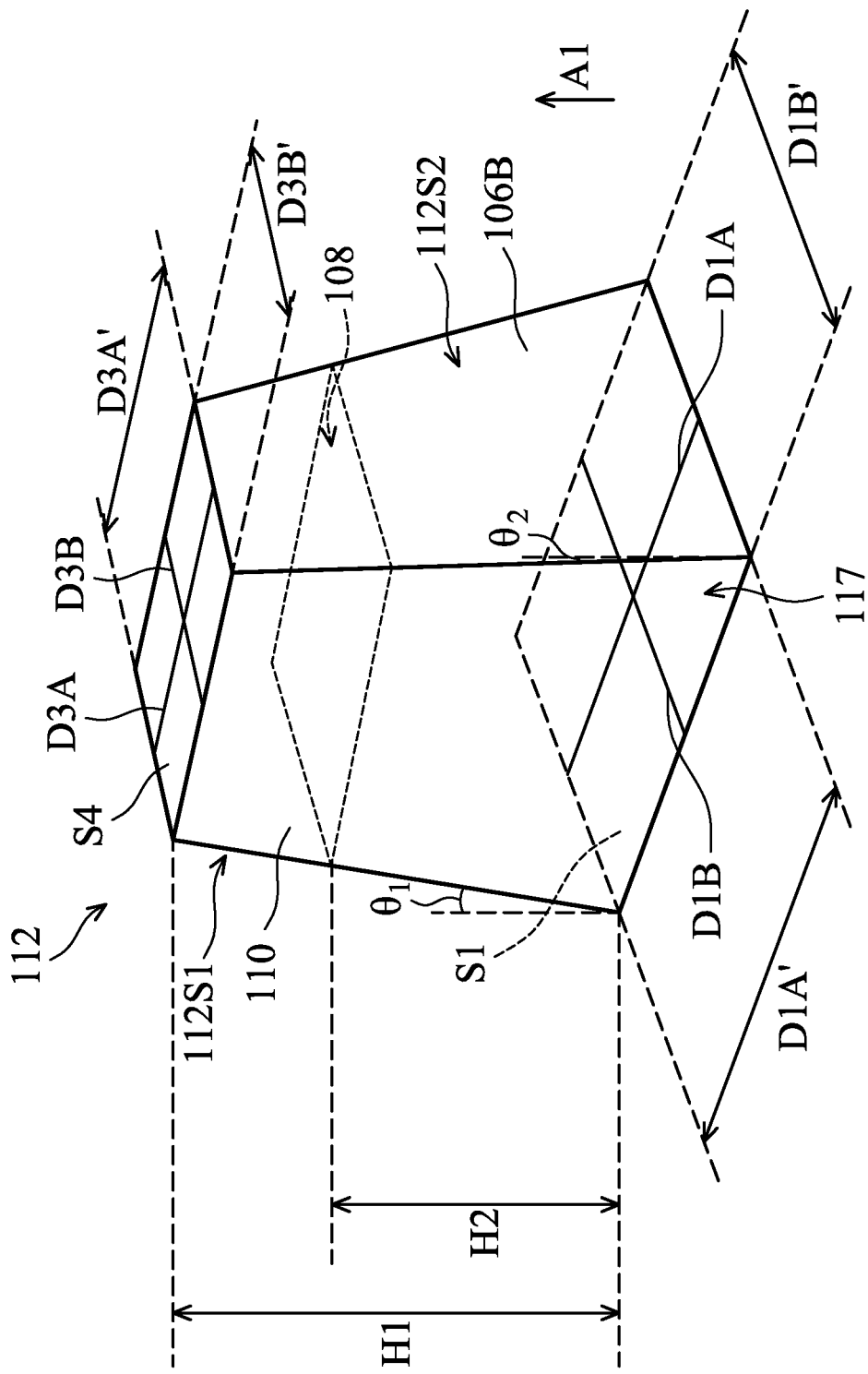
FIG. 7A is a schematic view of the stack structure in accordance with some embodiments of the present disclosure.

FIG. 7A is a schematic view of the stack structure 112 in accordance with some embodiments of the present disclosure. As shown in FIG. 7A, in some embodiments of the present disclosure, the distance of the first axis D1A (also referred to as the major axis D1A) of the first surface S1 is greater than the distance of the second axis D1B (also referred to as the minor axis D1B). In addition, the distance of the first axis D3A (also referred to as the major axis D3A) of the fourth surface S4 is greater than the distance of the second axis D3B (also referred to as the minor axis D3B). The first surface S1 and the fourth surface S4 have a rectangular shape. The relationship between the distance H1, the distance H2, the distance D3A' of the major axis D3A, the distance D3B' of the minor axis D3B, the distance D1A' of the major axis D1A, the distance D1B' of the minor axis D1B and the light-emitting effectiveness of the light-emitting diode 104, the half width at half maximum A of the emitted light along the direction of the major axis and the half width at half maximum B of the emitted light along the direction of the minor axis is shown in the following Table 4. In addition, although the first surface S1 and fourth surface S4 have the first axis and the second axis, this does not mean that the first surface S1 and fourth surface S4 need to be completely symmetrical. The first surface S1 and fourth surface S4 may only have a substantially corresponding shape. The wires or metal line may be omitted. The deviation resulted from the manufacture variation may also be omitted. In addition, in this embodiment, the stack structure 112 has a first sidewall 112S1 and a second sidewall 112S2 which are opposite to each other. And the size of the light-emitting opening 117 of the reflection layer coated on the first sidewall 112S1 and the second sidewall 112S2 is the first surface S1. The direction perpendicular to the first surface S1 and the fourth surface S4 is the direction A1. The acute angle between the first sidewall 112S1 of the stack structure 112 and the direction A1 is the first angle $\theta_1$, the acute angle between the second sidewall 112S2 of the stack structure 112 and the direction A1 is the second angle $\theta_2$. In this embodiment, as shown in FIG. 7A, the second angle $\theta_2$ and the first angle $\theta_1$ are the same.

TABLE 4

| H1 (um) | H2 (um) | D3A' (um) | D3B' (um) | D1A' (um) | D1B' (um) | Light-emitting effectiveness | | HWHM A | HWHM B |
|---|---|---|---|---|---|---|---|---|---|
| 7 | 6 | 1 | 0.5 | 1 | 0.50 | 2.60 lm | 5.20% | 50° | 40° |
| | | | | 2 | 1.00 | 10.36 lm | 20.72% | 60° | 50° |
| | | | | 3 | 1.50 | 22.05 lm | 44.11% | 58° | 580 |
| | | | | 4 | 2.00 | 26.78 lm | 53.56% | 45° | 45° |
| | | | | 5 | 2.50 | 28.70 lm | 57.40% | 35° | 30° |

TABLE 4-continued

| H1 (um) | H2 (um) | D3A' (um) | D3B' (um) | D1A' (um) | D1B' (um) | Light-emitting effectiveness | | HWHM A | HWHM B |
|---|---|---|---|---|---|---|---|---|---|
| 6 | 5 | 1 | 0.5 | 1 | 0.50 | 2.74 lm | 5.49% | 50° | 45° |
|   |   |   |   | 2 | 1.00 | 10.80 lm | 21.60% | 60° | 50° |
|   |   |   |   | 3 | 1.50 | 22.31 lm | 44.62% | 60° | 60° |
|   |   |   |   | 4 | 2.00 | 26.65 lm | 53.31% | 45° | 45° |
|   |   |   |   | 5 | 2.50 | 28.22 lm | 56.44% | 35° | 35° |
| 5 | 4 | 1 | 0.5 | 1 | 0.50 | 2.89 lm | 5.79% | 50° | 40° |
|   |   |   |   | 2 | 1.00 | 11.21 lm | 22.42% | 60° | 50° |
|   |   |   |   | 3 | 1.50 | 22.19 lm | 44.38% | 60° | 60° |
|   |   |   |   | 4 | 2.00 | 26.30 lm | 52.59% | 45° | 45° |
|   |   |   |   | 5 | 2.50 | 27.47 lm | 54.95% | 45° | 35° |
| 4 | 3 | 1 | 0.5 | 1 | 0.50 | 3.05 lm | 6.11% | 60° | 45° |
|   |   |   |   | 2 | 1.00 | 11.69 lm | 23.37% | 60° | 50° |
|   |   |   |   | 3 | 1.50 | 21.59 lm | 43.17% | 60° | 60° |
|   |   |   |   | 4 | 2.00 | 25.21 lm | 50.42% | 45° | 45° |
|   |   |   |   | 5 | 2.50 | 25.70 lm | 51.40% | 45° | 40° |
| 3 | 2 | 1 | 0.5 | 1 | 0.50 | 3.24 lm | 6.48% | 55° | 50° |
|   |   |   |   | 2 | 1.00 | 11.98 lm | 23.97% | 60° | 65° |
|   |   |   |   | 3 | 1.50 | 20.83 lm | 41.66% | 50° | 60° |
|   |   |   |   | 4 | 2.00 | 23.52 lm | 47.04% | 50° | 50° |
|   |   |   |   | 5 | 2.50 | 25.78 lm | 51.56% | 60° | 45° |

Figure 7B:
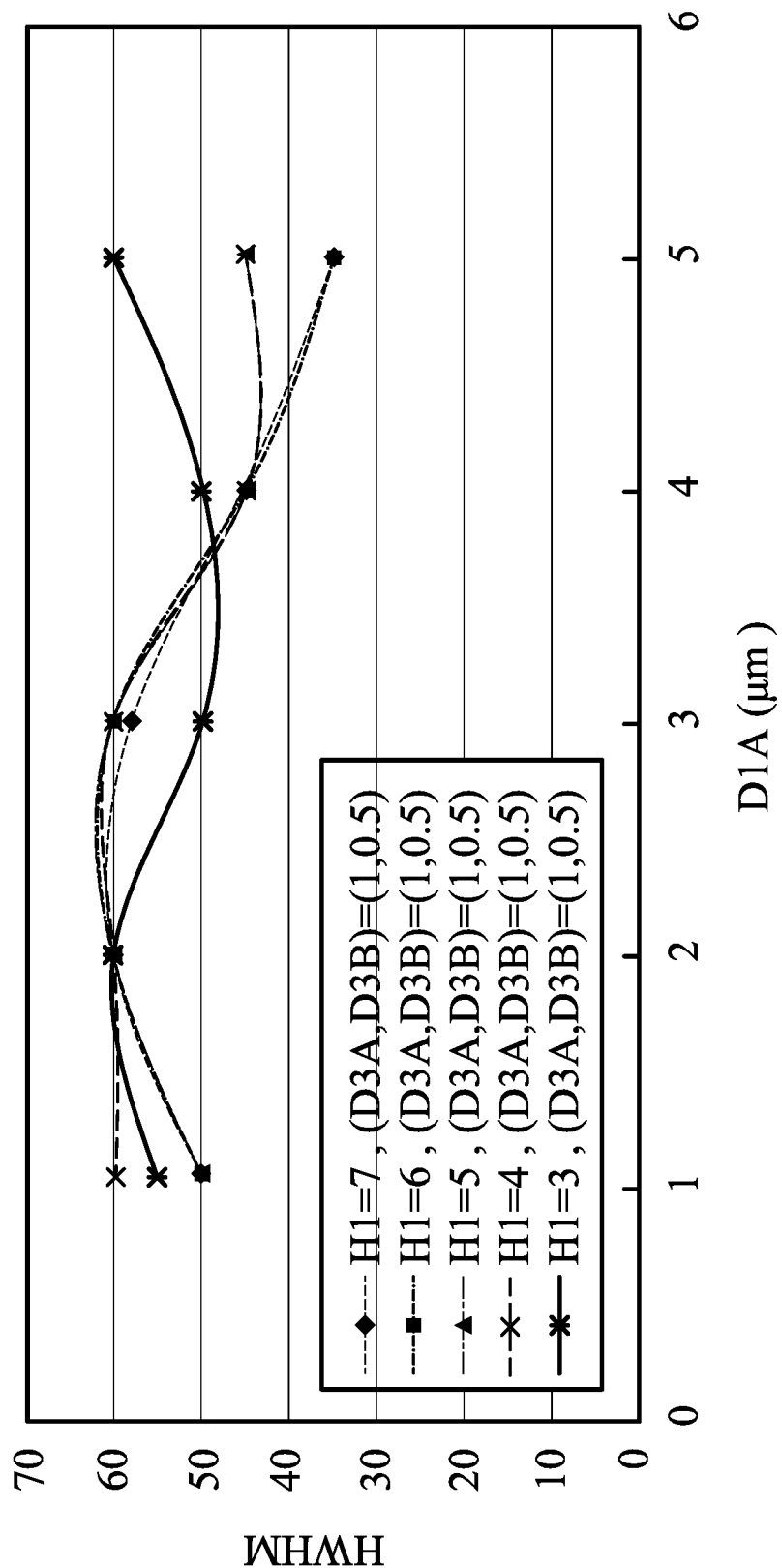
FIG. 7B is an analytical figure of the width of the major axis at the bottom surface of the stack structure versus the half width at half maximum in accordance with some embodiments of the present disclosure.
Figure 7C:
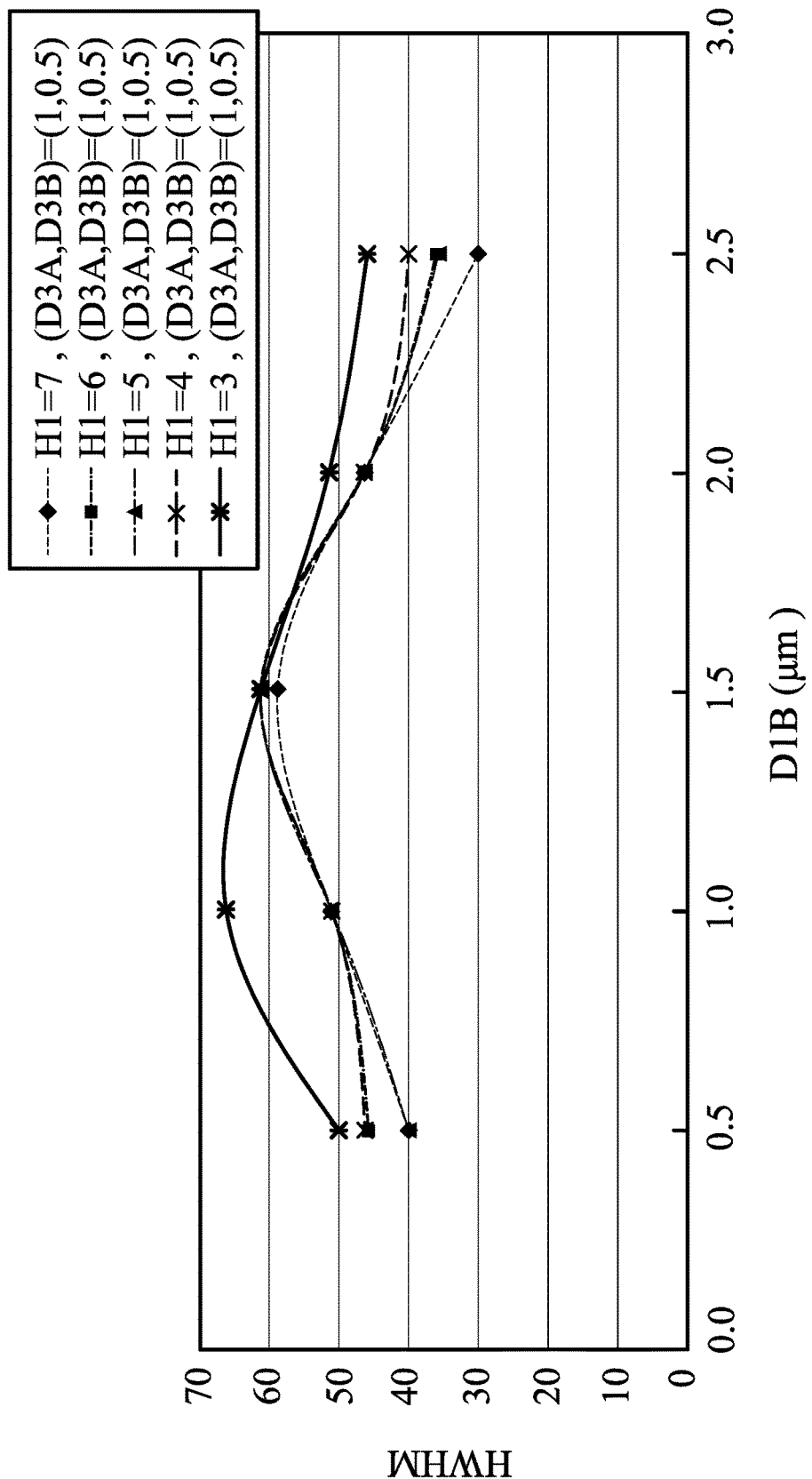
FIG. 7C is an analytical figure of the width of the minor axis at the bottom surface of the stack structure versus the half width at half maximum in accordance with some embodiments of the present disclosure.

In addition, FIG. 7B is an analytical figure of the distance MA of the major axis of the first surface S1 of the stack structure 112 (or the bottom surface of the stack structure 112) versus the half width at half maximum in accordance with this embodiment of the present disclosure. FIG. 7C is an analytical figure of the distance D1B of the minor axis of the first surface S1 of the stack structure 112 (or the bottom surface of the stack structure 112) versus the half width at half maximum in accordance with this embodiment of the present disclosure. The results shown in FIG. 7B and FIG. 7C correspond to the data shown in Table 4.

FIG. 7D is a distribution figure of the emitted light at various view angles in accordance with this embodiment of the present disclosure when the distance of the major axis D1A of the first surface S1 is 1 µm, the distance of the minor axis D1B of the first surface S1 is 0.5 µm, the distance of the major axis D3A of the fourth surface S4 is 1 µm, the distance of the minor axis D3B of the fourth surface S4 is 0.5 µm, the distance H1 is 7 µm and the distance H2 is 6 µm.

In addition, FIG. 7E is a distribution figure of the emitted light at various view angles in accordance with this embodiment of the present disclosure when the distance of the major axis MA of the first surface S1 is 2 µm, the distance of the minor axis D1B of the first surface S1 is 1 µm, the distance of the major axis D3A of the fourth surface S4 is 1 µm, the distance of the minor axis D3B of the fourth surface S4 is 0.5 µm, the distance H1 is 7 µm and the distance H2 is 6 µm.

In addition, FIG. 7F is a distribution figure of the emitted light at various view angles in accordance with this embodiment of the present disclosure when the distance of the major axis D1A of the first surface S1 is 3 µm, the distance of the minor axis D1B of the first surface S1 is 1.5 µm, the distance of the major axis D3A of the fourth surface S4 is 1 µm, the distance of the minor axis D3B of the fourth surface S4 is 0.5 µm, the distance H1 is 7 µm and the distance H2 is 6 µm.

Figure 7H:
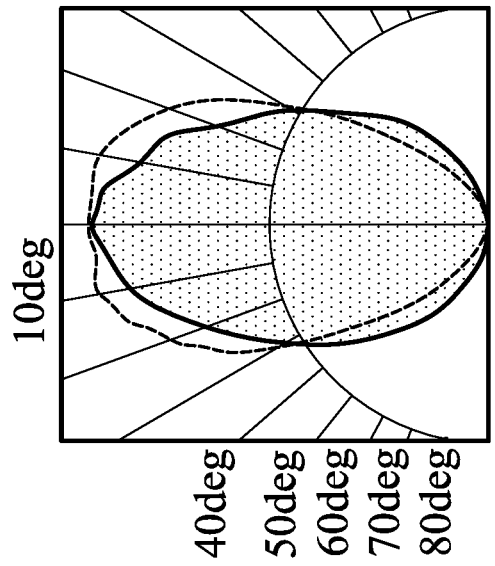
FIG. 7H is a distribution figure of the emitted light at various view angles in accordance with some embodiments of the present disclosure.
Figure 7G:
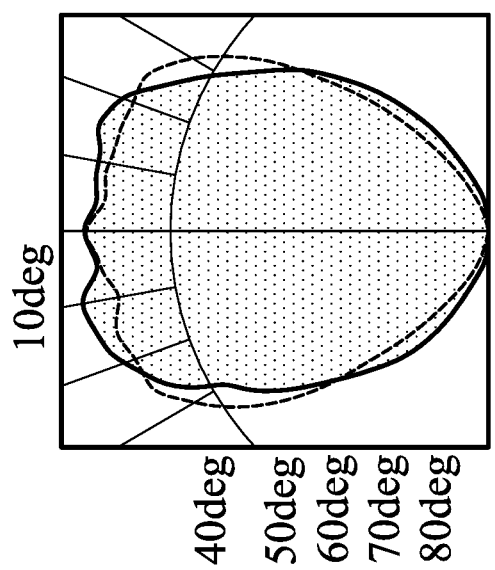
FIG. 7G is a distribution figure of the emitted light at various view angles in accordance with some embodiments of the present disclosure.

In addition, FIG. 7G is a distribution figure of the emitted light at various view angles in accordance with this embodiment of the present disclosure when the distance of the major axis D1A of the first surface S1 is 4 µm, the distance of the minor axis D1B of the first surface S1 is 2 µm, the distance of the major axis D3A of the fourth surface S4 is 1 µm, the distance of the minor axis D3B of the fourth surface S4 is 0.5 µm, the distance H1 is 7 µm and the distance H2 is 6 µm.

FIG. 7H is a distribution figure of the emitted light at various view angles in accordance with this embodiment of the present disclosure when the distance of the major axis D1A of the first surface S1 is 5 µm, the distance of the minor axis D1B of the first surface S1 is 2.5 µm, the distance of the major axis D3A of the fourth surface S4 is 1 µm, the distance of the minor axis D3B of the fourth surface S4 is 0.5 µm, the distance H1 is 7 µm and the distance H2 is 6 µm.

In addition, the solid line in FIGS. 5D-5H represents the distribution figure of the emitted light at various view angles along the direction of the major axis, and the dash line in FIGS. 5D-5H represents the distribution figure of the emitted light at various view angles along the direction of the minor axis.

Therefore, by tuning the distance of the major axis of the first surface and the distance of the minor axis of the first surface, the light-emitting diode display device of some embodiments of the present disclosure may alter the light-emitting view angle and the light-emitting shape freely.

Figure 8A:
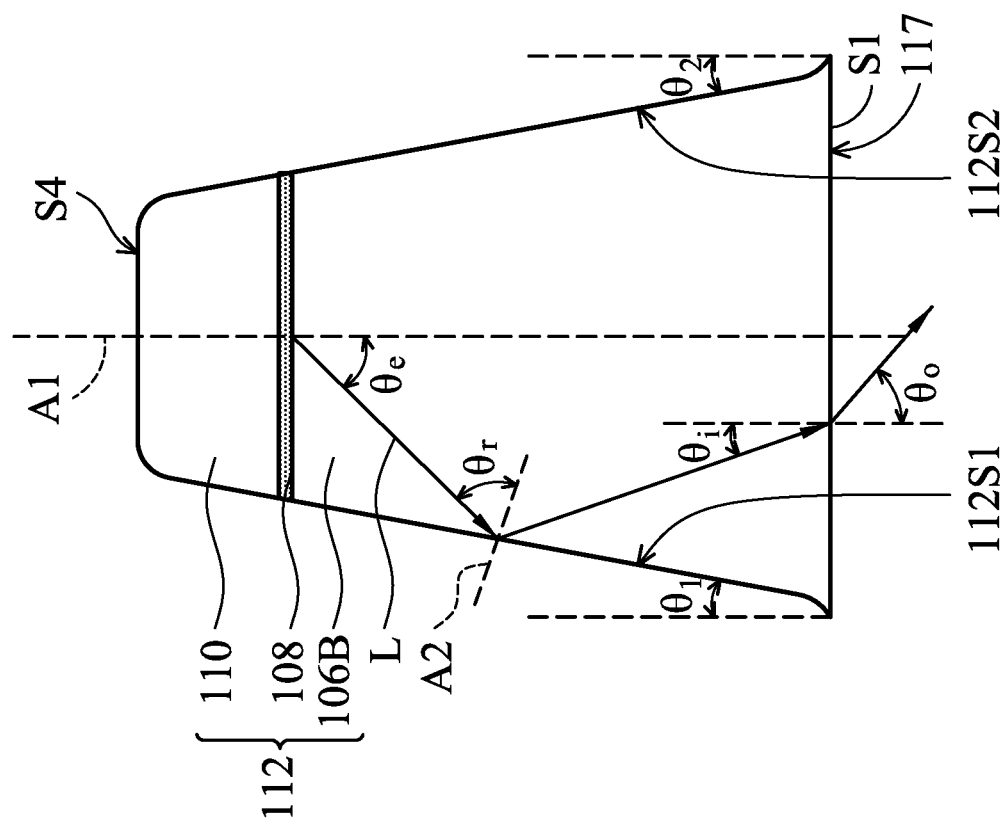
FIG. 8A is a cross-sectional view of the stack structure in accordance with some embodiments of the present disclosure.

FIG. 8A is a cross-sectional view of the stack structure 112 in accordance with some embodiments of the present disclosure. The light L is the light emitted from the light-emitting layer 108. The direction perpendicular to the first surface S1 and the fourth surface S4 is the direction A1, and the direction perpendicular to the first sidewall 112S1 of the stack structure 112 is the direction A2. The shape of the first surface S1 and the fourth surface S4 when viewed from a top view may be the shape shown in FIGS. 4A, 5A, 6A, 7A or any other suitable shape. In addition, in this embodiment, the size of the light-emitting opening 117 of the reflection layer coated on the first sidewall 112S1 and the second sidewall 112S2 is the first surface S1.

In the stack structure 112, the acute angle between the light L just emitted from the light-emitting layer 108 and the direction A1 at the light-emitting layer 108 is $\theta_e$, the acute angle between the light L and the direction A2 at the first sidewall 112S1 is $\theta_r$, the acute angle between the light L reflected by the sidewall 112S1 of the stack structure 112 and the direction A1 at the first surface S1 is θ In addition, the acute angle between the light L emitted from the stack structure 112 and the direction A1 at the first surface S1 is $\theta_o$. Since the thickness of the light-emitting layer is thinner than that of other layers, the thickness of the light-emitting layer is omitted in the embodiments of the present disclosure.

In addition, when viewed from a cross-sectional view, the acute angle between the direction A1 and the first sidewall 112S1 of the stack structure 112 is the first angle $\theta_1$. The first angle $\theta_1$ may range from about 1 to 89 degrees. In addition, the stack structure 112 may further include the second sidewall 112S2, and the first sidewall 112S1 and the second sidewall 112S2 are opposite to each other. The acute angle between the direction A1 and the second sidewall 112S2 of the stack structure 112 is the second angle $\theta_2$. In this embodiment, as shown in FIG. 8A, the second angle $\theta_2$ is the same as the first angle $\theta_1$.

As shown in FIG. 8A, the angle $\theta_r$ is equals 90° minus the angle $\theta_e$ and plus the first angle $\theta_1$ ($\theta_r=(90°-\theta_e)+\theta_1$), and the angle $\theta_i$ equals to 90° minus the angle $\theta_r$ and plus the first angle $\theta_1$ ($\theta_i=90°-(\theta_r+\theta_1)$). Therefore, the angle $\theta_i$ equals the angle $\theta_e$ minus two times the first angle $\theta_1$ ($\theta_i=\theta_e-(2\times\theta_1)$). If the light L is emitted from the stack structure 112 after n times reflections, the angle $\theta_i$ equals the angle $\theta_e$ minus 2n times the first angle $\theta_1$ ($\theta_i=\theta_e-(2n\times\theta_1)$).

In addition, according to Snell's Law, when n1 is the index of refraction of the bulk portion 106B (or the first conductive-type semiconductor layer 106) and n2 is the index of refraction of the medium that the light L is located at after being emitted from the stack structure 112 (or the bulk portion 106B), the angle $\theta_o$, the angle $\theta_i$, the index of refraction n1 and the index of refraction n2 have a relationship expressed by the following equation 2:

$$\theta_o = \sin^{-1}\frac{n1 \times \sin\theta 1}{n2}. \qquad \text{equation 2}$$

In some embodiments of the present disclosure, the material of the first conductive-type semiconductor layer 106 is GaN, and the index of refraction n1 is 2.38. The medium that the light L is located at after being emitted from the stack structure 112 (or the bulk portion 106B) is air and the index of refraction n2 is 1.

Figure 8B:
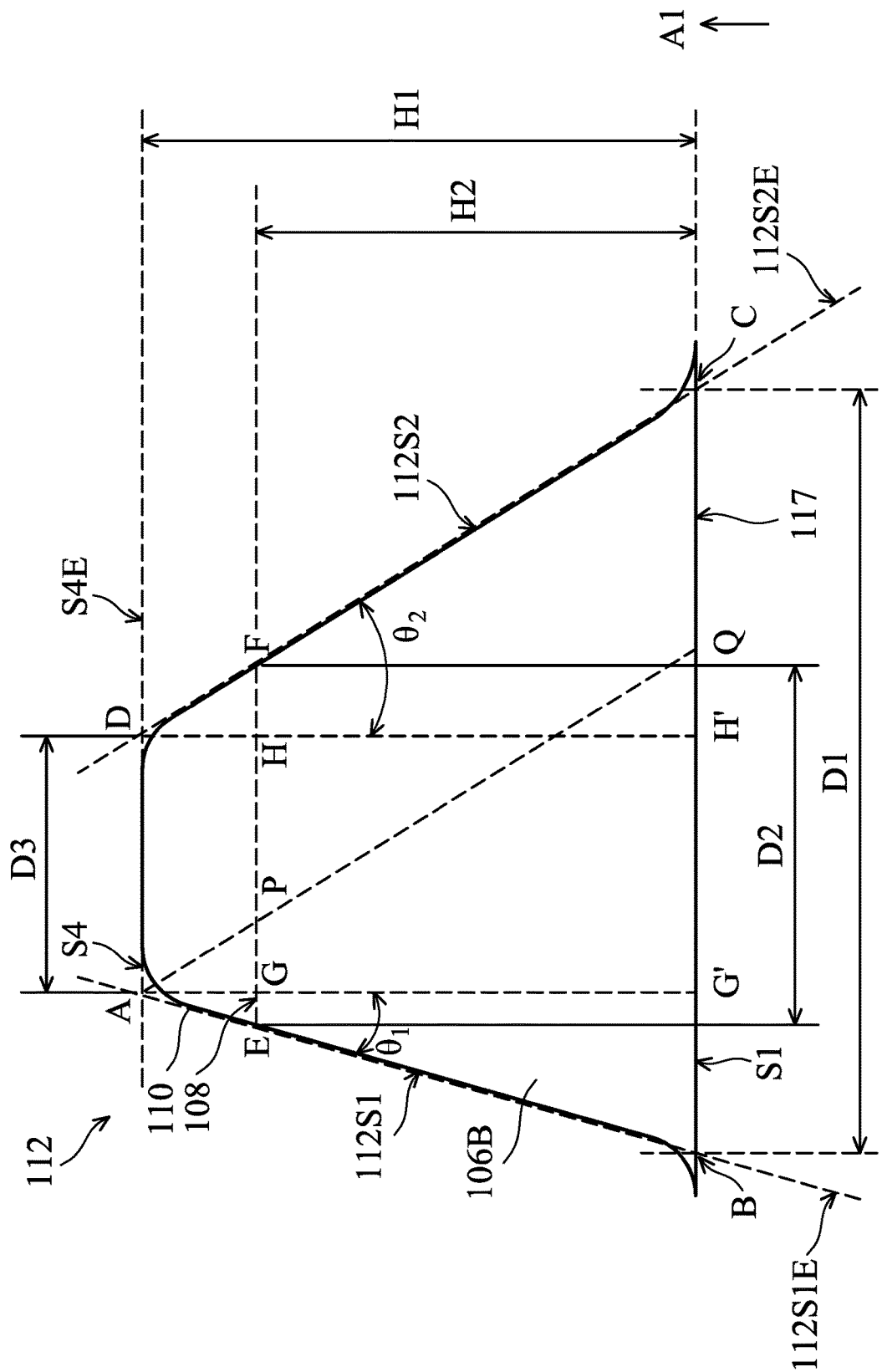
FIG. 8B is a cross-sectional view of the stack structure in accordance with some embodiments of the present disclosure.

FIG. 8B is a cross-sectional view of the stack structure 112 in accordance with some embodiments of the present disclosure. In this embodiment, the size of the light-emitting opening of the reflection layer coated on the first sidewall 112S1 and the second sidewall 112S2 is the first surface S1. The shape of the first surface S1 and the fourth surface S4 when viewed from a top view may be the shape shown in FIGS. 4A, 5A, 6A, 7A or any other suitable shape. As shown in FIG. 8B, the second angle $\theta_2$ is different from the first angle $\theta_1$. In addition, when viewed from a cross-sectional view, the extension line of the fourth surface S4 is the extension line S4E, the extension line of the first sidewall 112S1 is the extension line 112S1E, the extension line of the second sidewall 112S2 is the extension line 112S2E. The intersection point of the extension line S4E and the extension line 112S1E is the point A, the intersection point of the extension line S4E and the extension line 112S2E is the point D, the intersection point of the first surface S1 and the extension line 112S1E is the point B, the intersection point of the first surface S1 and the extension line 112S2E is the point C. In other words, the point B and the point C are two end points of the reflection layer on the first sidewall 112S1 and the second sidewall 112S2. Two end points of the light-emitting layer 108 (shown by dash line in FIG. 8B in order to clearly describe the embodiments of the present disclosure) are the point E and the point F. In addition, the projected point of the point A along the direction A1 on the light-emitting layer 108 is the point G, the projected point of the point A along the direction A1 on the first surface S1 is the point G', the projected point of the point D along the direction A1 on the light-emitting layer 108 is the point H, the projected point of the point D along the direction A1 on the first surface S1 is the point H'. In addition, the intersection point of the first surface S1 and the line which is parallel to the line DC and penetrates through the point A is the point Q. In other words, the line AQ is parallel to the line DC. In addition, the intersection of the line AQ and the light-emitting layer 108 (or the line EF) is the point P. Since the thickness of the light-emitting layer is thinner than that of other layers, the thickness of the light-emitting layer is omitted in the embodiments of the present disclosure.

According to FIG. 8B, the ratio of the length of the line AE to the length of the line AB equals the ratio of the length of the line EP to the length of the line BQ (the length of the line AE:the length of the line AB=the length of the line EP:the length of the line BQ). The length of the line AD is the width D3, the length of the line BC is the width D1. Accordingly, the ratio of the value derived by minus the distance H1 by the distance H2 to the distance H1 is equal to the ratio of the length of the line EP to the value derived by minus the width D1 by the width D3 ((H1−H2):H1=(the length of the line EP):(D1−D3)). Accordingly, the length of the line EP may be represented by the following equation 3:

$$\overline{EP} = \frac{(H1 \times H2) \times (D1-D3)}{H1}. \qquad \text{equation 3}$$

In addition, according to FIG. 8B, the length of the line PF is the width D3, and the width D2 of the light-emitting layer 108 equals the length of the line EP plus the length of the line PF. In other words, the width D2 of the light-emitting layer 108 may be represented by the following equation 4:

$$D2 = \frac{(H1-H2) \times (D1-D3)}{H1} + D3. \qquad \text{equation 4}$$

In addition, according to FIG. 8B, the width D2 of the light-emitting layer 108 may also be represented by the following equation 5:

$$D2=D3+[(H1-H2)\times(\tan\theta 1+\tan\theta 2)] \qquad \text{equation 5.}$$

It should be noted that, although the above equations 4 and 5 are used to represent the width D2 of the light-emitting layer 108 of the stack structure 112 shown in FIG. 8B in which the second angle $\theta_2$ is different from the first angle $\theta_1$, the equations 4 and 5 may also be used to represent the width D2 of the light-emitting layer 108 of the stack structure 112 shown in FIG. 8A in which the second angle $\theta_2$ is the same as the first angle $\theta_1$.

Figure 9A:
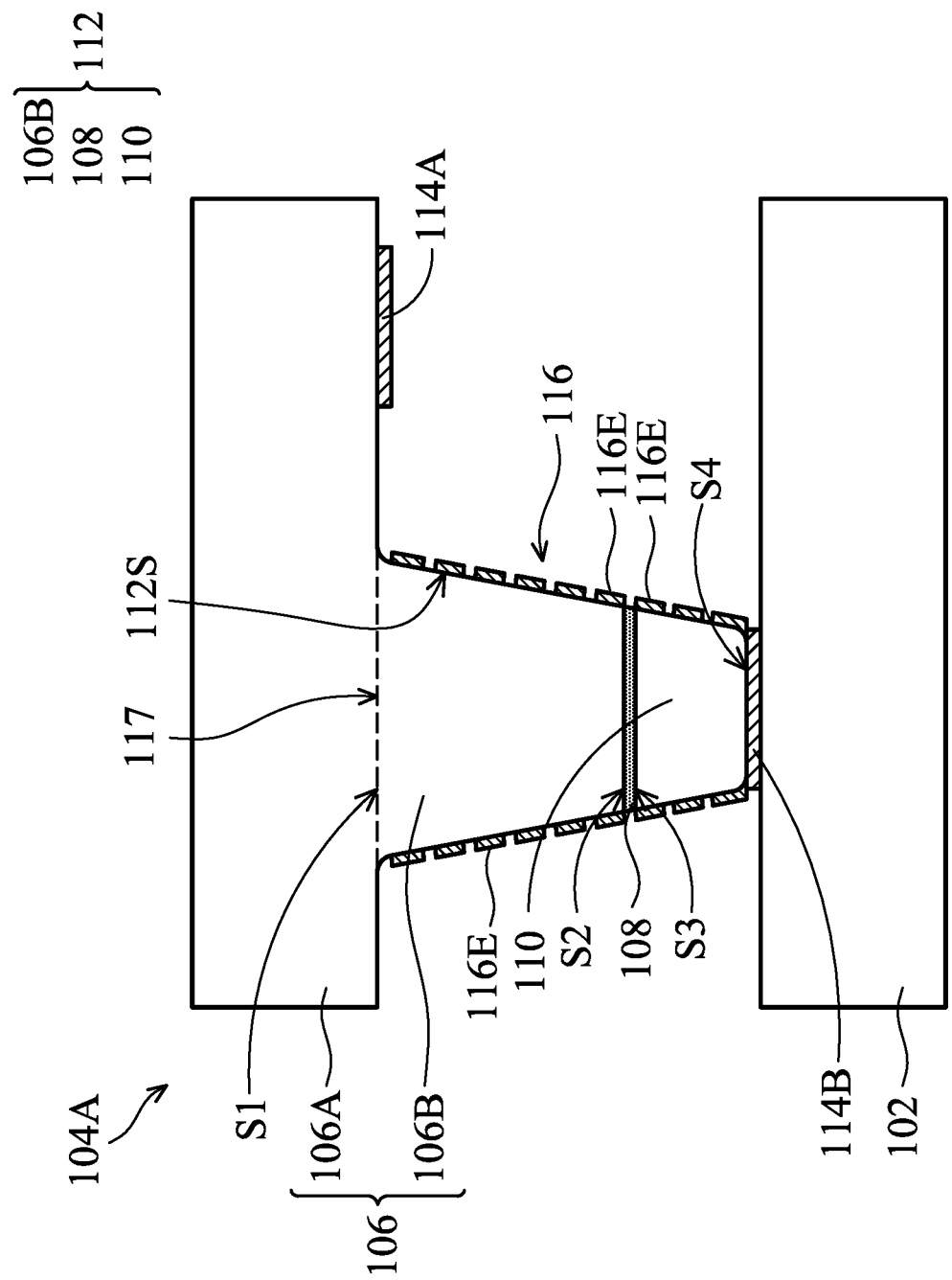
FIG. 9A is a cross-sectional view of a display device in accordance with some other embodiments of the present disclosure.

FIG. 9A is a cross-sectional view of a light-emitting diode 104A of a display device 200 in accordance with some other embodiments of the present disclosure. Note that the same or similar elements or layers corresponding to those of the semiconductor device are denoted by like reference numerals. The same or similar elements or layers denoted by like reference numerals have the same meaning and will not be repeated for the sake of brevity.

The difference between the embodiment shown in FIG. 9A and the embodiment shown in FIG. 1A is that the reflection layer 116 may include a plurality of sub-reflection layers 116E which are not electrically connected to each other. The plurality of sub-reflection layers 116E surrounds the stack structure 112. In addition, in some embodiments of the present disclosure, as shown in FIG. 9A, the reflection layer 116 may be in direct contact with the second electrode 114B. In addition, in some embodiments of the present disclosure, as shown in FIG. 9A, the sub-reflection layers 116E disposed over the sidewall 112S of the bulk portion 106B of the stack structure 112 are not electrically connected to the sub-reflection layers 116E disposed over the sidewall of the second conductive-type semiconductor layer 110. In this embodiment, the reflection layer 116 is substantially disposed over the entire sidewall 112S of the stack structure 112. Therefore, the size of the opening 117 along the light-emitting direction is the first surface S1, and the first surface S1 is overlapped with the bottom surface of the stack structure 112. The shape of the first surface S1 and the fourth surface S4 when viewed from a top view may be the shape shown in FIGS. 4A, 5A, 6A, 7A or any other suitable shape.

In other embodiments of the present disclosure, the size of the opening 117 along the light-emitting direction is the size of the bottom surface of the reflection layer 116 adjacent to the bottom surface of the stack structure 112. The size of the opening 117 along the light-emitting direction is the first surface S1, and the first surface S1 does not overlap with the bottom surface of the stack structure 112. In other words, similar to the embodiment shown in FIG. 1B, when the reflection layer 116 does not completely cover the entire sidewall 112S of the stack structure 112, the first surface S1 is defined by the datum surface formed by the opening 117 of the reflection layer 116 and is substantially parallel to the surface of the substrate portion 106A. In this embodiment, the first surface S1 may not coincide with the bottom surface of the bulk portion 106B.

Figure 9B:
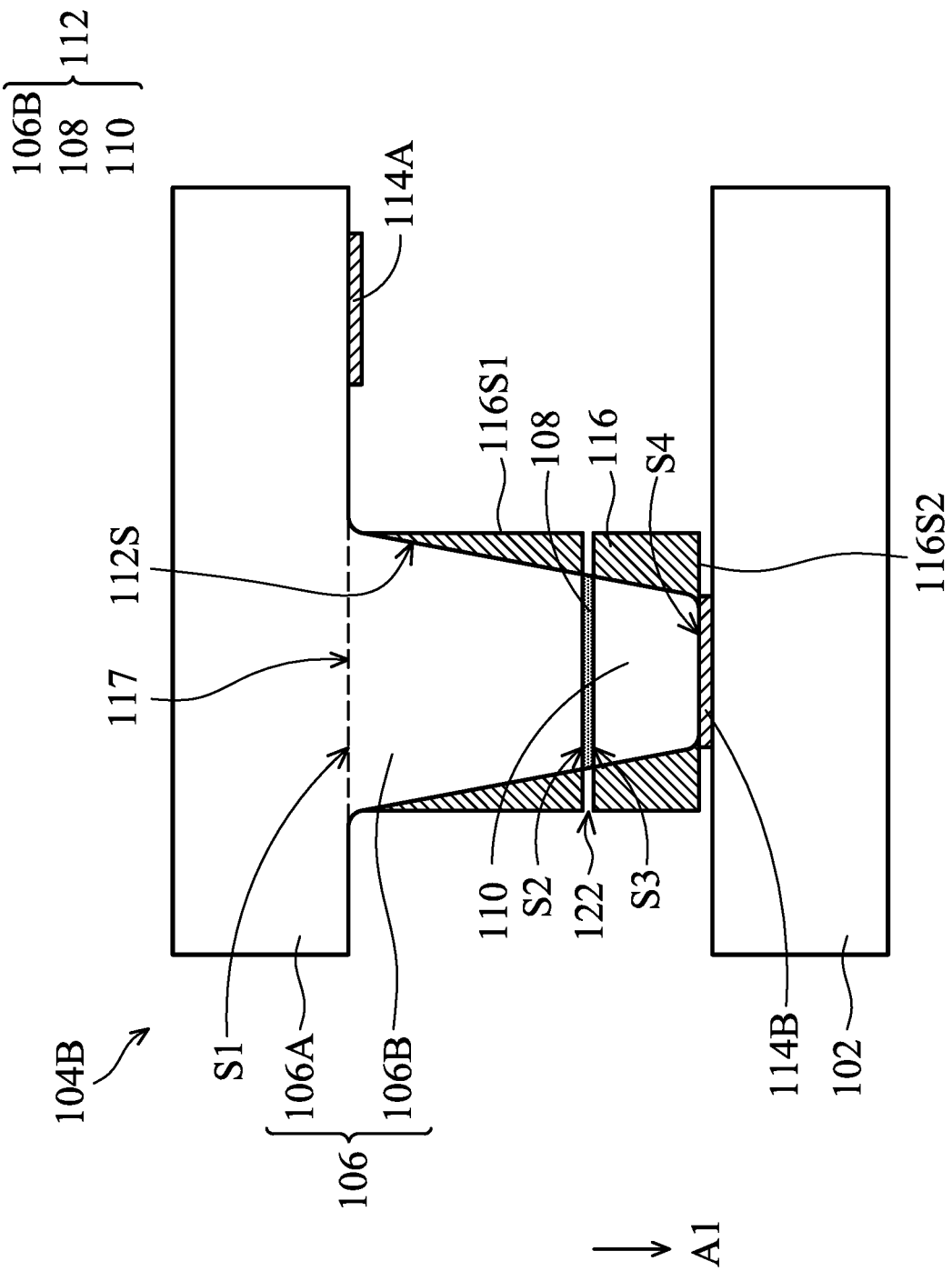
FIG. 9B is a cross-sectional view of a display device in accordance with some other embodiments of the present disclosure.

FIG. 9B is a cross-sectional view of a light-emitting diode 104B of a display device 300 in accordance with some other embodiments of the present disclosure. The difference between the embodiment shown in FIG. 9B and the embodiment shown in FIG. 9A is that the reflection layer 116 has a thickness which is gradually changed. In one embodiment, in some embodiments of the present disclosure, the thickness of the reflection layer 116 increases from the first surface S1 to the fourth surface S4. In addition, in some embodiments of the present disclosure, the portion of the reflection layer 116 corresponding to the light-emitting layer 108 may be broken off or spaced apart and may have a spacing 122. The spacing 122 may not be filled by any material or may be filled by an insulating layer. In addition, in this embodiment, the reflection layer 116 is substantially disposed over the entire sidewall 112S of the stack structure 112. Since the opening in the light-emitting direction is the first surface S1, the first surface S1 is overlapped with the bottom surface of the stack structure 112. The shape of the first surface S1 and the fourth surface S4 when viewed from a top view may be the shape shown in FIGS. 4A, 5A, 6A, 7A or any other suitable shape. In other embodiments of the present disclosure, the size of the opening along the light-emitting direction is the size of the bottom surface of the reflection layer 116 adjacent to the bottom surface of the stack structure 112. The size of the opening along the light-emitting direction is the first surface S1, and the first surface S1 does not overlap with the bottom surface of the stack structure 112. In other words, similar to the embodiment shown in FIG. 1B, when the reflection layer 116 does not completely cover the entire sidewall 112S of the stack structure 112, the first surface S1 is defined by the datum surface formed by the opening of the reflection layer 116 and is substantially parallel to the surface of the substrate portion 106A. In this embodiment, the first surface S1 may not coincide with the bottom surface of the bulk portion 106B.

In addition, in some embodiments of the present disclosure, the sidewall 116S1 of the reflection layer 116 may be perpendicular to the first surface S1, and the surface 116S2 of the reflection layer 116 has a height that is the same as that of the fourth surface S4.

In some embodiments of the present disclosure, a reflection layer 116 with a thickness which is gradually changed may be formed by the following steps. First, a patterned mask is formed, exposing the region which is predetermined to form the reflection layer 116. Subsequently, the material of the reflection layer is deposited to form the reflection layer 116.

Figure 9C:
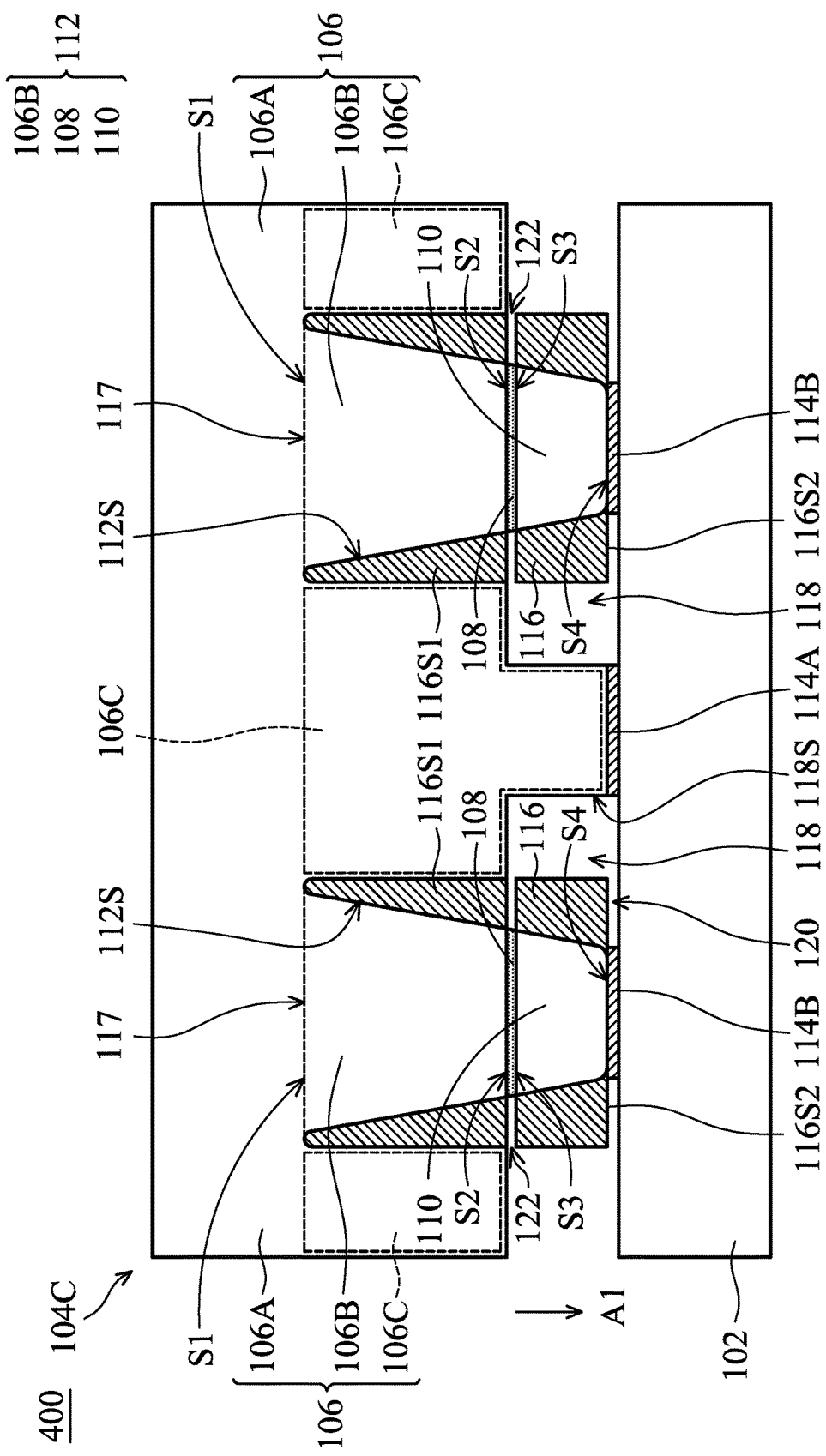
FIG. 9C is a cross-sectional view of a display device in accordance with some other embodiments of the present disclosure.

FIG. 9C is a cross-sectional view of a light-emitting diode 104C of a display device 400 in accordance with some other embodiments of the present disclosure. The difference between the embodiment shown in FIG. 9C and the embodiment shown in FIG. 9B is that the first conductive-type semiconductor layer 106 may further include a plurality of pillar portions 106C disposed over the substrate portion 106A. In addition, there is a recess 118 formed by two adjacent pillar portions 106C of the plurality of pillar portions 106C and the substrate portion 106A. In addition, the bulk portion 106B is disposed in the recess 118. In addition, in this embodiment, the reflection layer 116 is substantially disposed over the entire sidewall 112S of the stack structure 112. Since the opening at the light-emitting direction is the first surface S1, the first surface S1 is overlapped with the bottom surface of the stack structure 112. The shape of the first surface S1 and the fourth surface S4 when viewed from a top view may be the shape shown in FIGS. 4A, 5A, 6A, 7A or any other suitable shape. The shapes of the first surface S1 and the fourth surface S4 in different stack structures 112 may be different. In other embodiments of the present disclosure, the size of the opening 117 along the light-emitting direction is the size of the bottom surface of the reflection layer 116 adjacent to the bottom surface of the stack structure 112. The size of the opening along the light-emitting direction is the first surface S1, and the first surface S1 does not overlap with the bottom surface of the stack structure 112. In other words, similar to the embodiment shown in FIG. 1B, when the reflection layer 116 does not completely cover the entire sidewall 112S of the stack structure 112, the first surface S1 is defined by the datum surface formed by the opening 117 of the reflection layer 116 and is substantially parallel to the surface of the substrate portion 106A. In this embodiment, the first surface S1 may not coincide with the bottom surface of the bulk portion 106B.

In addition, in some embodiments of the present disclosure, a spacing 120 is disposed between the bulk portion 106B and the sidewall 118S of the recess 118. The reflection layer 116 is disposed in the spacing 120, as shown in FIG. 9C. In other embodiments of the present disclosure, the spacing 120 is not completely filled by the reflection layer. The spacing 120 may only be partially filled by the reflection layer. As long as the design of the reflection layer may achieve the effect of altering the light shape or improving the light-emitting effectiveness.

In addition, in some embodiments of the present disclosure, the portion of the reflection layer 116 corresponding to the light-emitting layer 108 may be broken off or spaced apart and may have a spacing 122. The spacing 122 may not be filled by any material or may be filled by an insulating layer.

In some embodiments of the present disclosure, the light-emitting diode 104C in FIG. 9C may be formed by the following steps. First, the light-emitting diode in FIG. 9B is formed. But the first electrode and the second electrode are not formed yet. Subsequently, a first conductive type material is deposited to form a plurality of pillar portions 106C. Subsequently, the first electrode 114A, the second electrode 114B and the reflection layer 116 are formed, and the first electrode 114A is formed over the pillar portions 106C. However, in other embodiments of the present disclosure, one or a plurality of etching and deposition steps (used to deposit the light-emitting layer 108, the second conductive-type semiconductor layer 110 and/or the bulk portion 106B) may be performed on a first conductive-type semiconductor substrate (not shown) to form spacing 120, the stack structure 112 and the plurality of pillar portions 106C. However, it should be noted that the embodiments of the present disclosure is not limited thereto. The light-emitting diode 104C in FIG. 9C may be formed by any other suitable manufacturing method. In addition, in some embodiments of the present disclosure, the substrate portion 106A, the bulk portion 106B and the pillar portions 106C of the first conductive-type semiconductor layer 106 may be formed in one piece. However, in other embodiments of the present disclosure, the substrate portion 106A and the bulk portion 106B are formed in one piece, whereas the substrate portion 106A and the pillar portions 106C are not formed in one piece.

In summary, in some embodiments of the present disclosure, since the specific width and distance in the stack structure of the light-emitting diode have a specific relationship, the light-emitting diode display device in some embodiments of the present disclosure may alter the light-emitting view angle and the light-emitting shape freely. In addition, an additional second lens is not needed in the embodiments of the present disclosure to alter the light-emitting view angle and the light-emitting shape.

Note that the above element sizes, element parameters, and element shapes are not limitations of the present disclosure. Those skilled in the art can adjust these settings or values according to different requirements. It should be understood that the display device and method for manufacturing the same of the present disclosure are not limited to the configurations of FIGS. 1 to 9C. The present disclosure may merely include any one or more features of any one or more embodiments of FIGS. 1 to 9C. In other words, not all of the features shown in the figures should be implemented in the display device and method for manufacturing the same of the present disclosure.

In addition, in some embodiments of the present disclosure, the reflection layer may only be disposed over the sidewall of the bulk portion of the first conductive-type semiconductor layer. The reflection layer 116 may be optionally disposed over the substrate portion of the first conductive-type semiconductor layer. As long as the reflection layer is disposed over at least some regions of the light-emitting path, the light-emitting shape may be altered or the light-emitting effectiveness may be improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A display device, comprising:
a substrate;
a light-emitting diode disposed over the substrate, wherein the light-emitting diode comprises:
a first conductive-type semiconductor layer, a light-emitting layer and a second conductive-type semiconductor layer, wherein the light-emitting layer is disposed between the first conductive-type semiconductor layer and the second conductive-type semiconductor layer, wherein the second conductive-type semiconductor layer is adjacent to the substrate,
wherein the first conductive-type semiconductor layer comprises a bulk portion and a reflection layer disposed over a side of the bulk portion, wherein the bulk portion has a first surface away from the light-emitting layer and a second surface adjacent to the light-emitting layer, and the second conductive-type semiconductor layer has a third surface adjacent to the light-emitting layer and a fourth surface away from the light-emitting layer;
wherein when viewed from a cross-sectional view, a width of the first surface is width D1, a width of the light-emitting layer is width D2, a distance from the first surface to the fourth surface is distance H1, and a distance from the first surface to the light-emitting layer is distance H2,
wherein $$0.269 \leq \frac{(D2 \times H2)}{(D1 \times H1)} \leq 0.857.$$

2. The display device as claimed in claim 1, wherein a width of the fourth surface is width D3, and the width D2 of the light-emitting layer is represented by the following equation:

$$D2 = \frac{(H1 - H2) \times (D1 - D3)}{H1} + D3.$$

3. The display device as claimed in claim 1, wherein a direction perpendicular to the first surface of the bulk portion is a first direction, wherein when viewed from a cross-sectional view, an acute angle between a first sidewall of the bulk portion and the first direction is a first angle, and the first angle ranges from about 1 to 89 degrees.

4. The display device as claimed in claim 3, wherein when viewed from a cross-sectional view, the bulk portion further comprises a second sidewall, and the first sidewall and the second sidewall are opposite to each other, wherein an acute angle between the second sidewall of the bulk portion and the first direction is a second angle, and the second angle is substantially the same as the first angle.

5. The display device as claimed in claim 3, wherein when viewed from a cross-sectional view, the bulk portion further comprises a second sidewall, and the first sidewall and the second sidewall are opposite to each other, wherein an acute angle between the second sidewall of the bulk portion and the first direction is a second angle, and the second angle is different from the first angle.

6. The display device as claimed in claim 1, wherein an area of the first surface is greater than an area of the fourth surface.

7. The display device as claimed in claim 1, further comprising:
a first electrode electrically connected to the first conductive-type semiconductor layer; and
a second electrode electrically connected to the second conductive-type semiconductor layer.

8. The display device as claimed in claim 7, wherein the second electrode completely covers the fourth surface of the second conductive-type semiconductor layer.

9. The display device as claimed in claim 7, wherein the first electrode is disposed over a surface of the first conductive-type semiconductor layer.

10. The display device as claimed in claim 1, further comprising:
an insulating layer disposed between the reflection layer and the bulk portion.

11. The display device as claimed in claim 1, wherein the reflection layer is in direct contact with the bulk portion.

12. The display device as claimed in claim 7, wherein the reflection layer is electrically isolated from the second electrode.

13. The display device as claimed in claim 1, wherein the reflection layer is further disposed over a sidewall of the second conductive-type semiconductor layer, wherein the reflection layer disposed over the side of the bulk portion is not electrically connected to the reflection layer disposed over the sidewall of the second conductive-type semiconductor layer.

14. The display device as claimed in claim 1, wherein the reflection layer comprises a plurality of sub-reflection layers, and the plurality of sub-reflection layers are not electrically connected to each other.

15. The display device as claimed in claim 1, wherein the reflection layer has a thickness which is gradually changed.

16. The display device as claimed in claim 15, wherein a sidewall of the reflection layer is perpendicular to the first surface.

17. The display device as claimed in claim 15, wherein a surface of the reflection layer has a height that is substantially the same as that of the fourth surface.

18. The display device as claimed in claim 1, wherein when viewed from a cross-sectional view, the first conductive-type semiconductor layer further comprises:
a substrate portion and two pillar portions, wherein the two pillar portions are disposed over the substrate portion, and the two pillar portions and the substrate portion forms a recess, wherein the bulk portion is disposed in the recess.

19. The display device as claimed in claim 18, wherein the reflection layer is disposed in a spacing between the bulk portion and a sidewall of the recess.

* * * * *